US011112608B2

(12) United States Patent
Trail et al.

(10) Patent No.: US 11,112,608 B2
(45) Date of Patent: Sep. 7, 2021

(54) SYSTEMS, APPARATUSES, AND METHODS FOR IMAGE SHIFTING IN MONOCHROMATIC DISPLAY DEVICES

(71) Applicant: Facebook Technologies, LLC, Menlo Park, CA (US)

(72) Inventors: Nicholas Daniel Trail, Bothell, WA (US); James Ronald Bonar, Redmond, WA (US); Gareth Valentine, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 239 days.

(21) Appl. No.: 16/157,554

(22) Filed: Oct. 11, 2018

(65) Prior Publication Data

US 2019/0227319 A1 Jul. 25, 2019

Related U.S. Application Data

(60) Provisional application No. 62/620,432, filed on Jan. 22, 2018, provisional application No. 62/620,434, (Continued)

(51) Int. Cl.
*G02B 6/293* (2006.01)
*G02B 6/12* (2006.01)
(Continued)

(52) U.S. Cl.
CPC ..... *G02B 27/0172* (2013.01); *G02B 6/12007* (2013.01); *G02B 6/29316* (2013.01);
(Continued)

(58) Field of Classification Search
CPC ........ G02B 2027/0116; G02B 27/0172; G02B 2027/0112; G02B 2027/0118;
(Continued)

(56) References Cited

U.S. PATENT DOCUMENTS 7,747,113 B2 6/2010 Mukawa et al.
8,189,263 B1 5/2012 Wang et al.
(Continued)

FOREIGN PATENT DOCUMENTS

CN 104656259 B 4/2017
CN 107111204 A 8/2017
(Continued)

OTHER PUBLICATIONS

International Search Report and Written Opinion received for PCT Application Serial No. PCT/US2018/063919 dated Mar. 20, 2019, 18 pages.

(Continued)

*Primary Examiner* — Brandi N Thomas
(74) *Attorney, Agent, or Firm* — FisherBroyles, LLP

(57) ABSTRACT

The disclosed apparatus may include (1) a plurality of monochromatic emitter arrays, where each of the plurality of monochromatic emitter arrays has a plurality of emitters disposed in a two-dimensional configuration and emits a monochromatic image of a corresponding color, (2) a waveguide configuration that includes (a) a top surface, (b) a bottom surface disposed opposite the top surface, (c) a coupling area that receives the monochromatic images, and (d) a decoupling area that projects a plurality of instances of a polychromatic image including a combination of the monochromatic images toward an eyebox through the bottom surface, and (3) an actuator system that produces lateral shifting of the plurality of instances of the polychromatic image between at least two positions relative to the waveguide configuration. Various other methods and systems are also disclosed.

14 Claims, 22 Drawing Sheets

Related U.S. Application Data filed on Jan. 22, 2018, provisional application No. 62/620,435, filed on Jan. 22, 2018.

(51) Int. Cl.
| | |
|---|---|
| *G02B 27/01* | (2006.01) |
| *G02B 27/09* | (2006.01) |
| *G03B 21/14* | (2006.01) |
| *G03B 21/20* | (2006.01) |

(52) U.S. Cl.
CPC ....... *G02B 27/0955* (2013.01); *G03B 21/142* (2013.01); *G03B 21/2033* (2013.01); *G02B 2027/014* (2013.01); *G02B 2027/0112* (2013.01); *G02B 2027/0116* (2013.01); *G02B 2027/0147* (2013.01); *G02B 2027/0178* (2013.01)

(58) Field of Classification Search
CPC ...... G02B 2027/014; G02B 2027/0147; G02B 2027/0178; G02B 27/0081; G02B 27/0955; G02B 27/102; G02B 6/12007; G02B 6/29316; G02B 6/29328; G02B 21/367; G02B 2027/0134; G02B 2027/015; G02B 2027/0174; G02B 27/4272; A61B 2562/0295; A61B 5/14507; A61B 5/14532; A61B 5/14535; A61B 5/14546; A61B 5/1455; A61B 5/150022; A61B 5/150068; A61B 5/150083; A61B 5/150099; A61B 5/150114; A61B 5/150183; A61B 5/150305; A61B 5/150358; A61B 5/150389; A61B 5/150419; A61B 5/150519; A61B 5/150572; A61B 5/150755; A61B 5/150786; A61B 5/150809; A61B 5/150816; A61B 5/150824; A61B 5/1509; A61B 5/150984; A61B 5/15109; A61B 5/15111; A61B 5/15113; A61B 5/15117; A61B 5/15151; A61B 5/15161; A61B 5/15163; A61B 5/15176; A61B 5/15182; A61B 5/157; A61B 5/742; A61B 5/0051; A61B 5/0084; A61B 5/0062; A61B 5/0066; A61B 5/0071; A61B 5/0073; A61B 5/0075; A61B 5/0086; A61B 5/02007

See application file for complete search history.

(56) References Cited

U.S. PATENT DOCUMENTS

| | | | |
|---|---|---|---|
| 8,611,014 | B2 | 12/2013 | Valera et al. |
| 8,903,207 | B1 | 12/2014 | Brown et al. |
| 8,965,152 | B2 | 2/2015 | Simmonds |
| 9,899,000 | B2 | 2/2018 | Takahota et al. |
| 10,191,288 | B2 | 1/2019 | Singer et al. |
| 10,345,591 | B2 | 7/2019 | Samec et al. |
| 2004/0174348 | A1 | 9/2004 | David |
| 2005/0231651 | A1 | 10/2005 | Myers et al. |
| 2006/0221448 | A1 | 10/2006 | Nivon et al. |
| 2010/0149073 | A1 | 6/2010 | Chaum et al. |
| 2011/0026128 | A1 | 2/2011 | Baker et al. |
| 2012/0062850 | A1 | 3/2012 | Travis |
| 2012/0062998 | A1 | 3/2012 | Schultz et al. |
| 2013/0077049 | A1 | 3/2013 | Bohn |
| 2013/0208003 | A1 | 8/2013 | Bohn et al. |
| 2013/0208352 | A1 | 8/2013 | Simmonds et al. |
| 2013/0208482 | A1 | 8/2013 | Fleck et al. |
| 2014/0140653 | A1 | 5/2014 | Brown et al. |
| 2014/0140654 | A1 | 5/2014 | Brown et al. |
| 2015/0235460 | A1 | 8/2015 | Schowengerdt et al. |
| 2015/0260994 | A1 | 9/2015 | Akutsu et al. |
| 2015/0260995 | A1 | 9/2015 | Mukawa |
| 2017/0276948 | A1 | 9/2017 | Welch et al. |
| 2017/0357089 | A1 | 12/2017 | Tervo et al. |
| 2018/0164591 | A1* | 6/2018 | Saarikko ............ G02B 27/0172 |
| 2018/0172995 | A1 | 6/2018 | Lee et al. |
| 2018/0210205 | A1 | 7/2018 | Grey et al. |
| 2018/0231779 | A1 | 8/2018 | Bohn |
| 2018/0364487 | A1 | 12/2018 | Yeoh et al. |
| 2019/0064430 | A1 | 2/2019 | Groppo et al. |
| 2019/0227317 | A1 | 7/2019 | Trail et al. |
| 2019/0227318 | A1 | 7/2019 | Trail et al. |
| 2020/0021784 | A1 | 1/2020 | Grusche |

FOREIGN PATENT DOCUMENTS

| | | |
|---|---|---|
| CN | 107357126 A | 11/2017 |
| EP | 2 196 729 A1 | 6/2010 |
| JP | 2009-133999 A | 6/2009 |
| JP | 2010-152248 A | 7/2010 |
| JP | 2017-015798 A | 1/2017 |
| WO | 2015/081313 A2 | 6/2015 |
| WO | 2017/102795 A1 | 6/2017 |
| WO | 2019/143413 A1 | 7/2019 |
| WO | 2019/143414 A1 | 7/2019 |
| WO | 2019/143416 A1 | 7/2019 |

OTHER PUBLICATIONS

Non-Final Office Action received for U.S. Appl. No. 16/156,452 dated May 13, 2020, 38 pages.
International Preliminary Report on Patentability received for PCT Application Serial No. PCT/US2018/064042 dated Aug. 6, 2020, 9 pages.
International Preliminary Report on Patentability received for PCT Application Serial No. PCT/US2018/063925 dated Aug. 6, 2020, 8 pages.
International Preliminary Report on Patentability received for PCT Application Serial No. PCT/US2018/063919 dated Aug. 6, 2020, 9 pages.
Fitzsimmons, Michelle, "Hands on: Microsoft Hololens", accessed at https://www.techradar.com/reviews/wearables-microsoft-hololens-1281834/review, Jun. 14, 2017, 12 pages.
Marvin, Rob, "Snapchat Spectacles: Everything You Need to Know", accessed at https://www.pcmag.com/article/350013/snapchat-spectacles-everything-you-need-to-know, Feb. 21, 2017, 9 pages.
Krees et al., "Diffractive and Holographic Optics as Optical Combiners in Head Mounted Displays", UbiComp'13, Sep. 8-12, 2013, Zurich, Switzerland, pp. 1479-1482.
International Search Report and Written Opinion received for PCT Application Serial No. PCT/US2018/064042 dated Mar. 22, 2019, 12 pages.
International Search Report and Written Opinion received for PCT Serial Application No. PCT/US2018/063925 dated Mar. 22, 2019, 11 pages.
Trail et al., "Systems, Apparatuses, and Methods for Monochromatic Display Waveguides", U.S. Appl. No. 16/157,544, filed Oct. 11, 2018, 106 pages.
Trail et al., "Systems, Devices, and Methods for Tiled Multi-Monochromatic Displays", U.S. Appl. No. 16/156,452, filed Oct. 10, 2018, 103 pages.
Notice of Allowance received for U.S. Appl. No. 16/156,452 dated Oct. 28, 2020, 37 pages.
Non-Final Office Action received for U.S. Appl. No. 16/157,544 dated Jan. 22, 2021, 45 pages.
Extended European Search Report received for EP Patent Application Serial No. 18900674.5 dated Feb. 3, 2021, 7 pages.
Extended European Search Report received for EP Patent Application Serial No. 18901262.8 dated Feb. 3, 2021, 7 pages.
Extended European Search Report received for EP Patent Application Serial No. 18901737.9 dated Feb. 8, 2021, 8 pages.

* cited by examiner

SYSTEMS, APPARATUSES, AND METHODS FOR IMAGE SHIFTING IN MONOCHROMATIC DISPLAY DEVICES

CROSS-REFERENCE TO RELATED APPLICATIONS

This application claims priority to and the benefit of U.S. Provisional Application No. 62/620,432, which is entitled "SYSTEMS, DEVICES, AND METHODS FOR TILED MULTI-MONOCHROMATIC DISPLAYS" and was filed on Jan. 22, 2018; U.S. Provisional Application No. 62/620,434, which is entitled "SYSTEMS, APPARATUSES, AND METHODS FOR MONOCHROMATIC DISPLAY WAVEGUIDES" and was filed on Jan. 22, 2018; and U.S. Provisional Application No. 62/620,435, which is entitled "SYSTEMS, APPARATUSES, AND METHODS FOR COMPONENT MOVEMENT IN MONOCHROMATIC DISPLAY DEVICES" and was filed on Jan. 22, 2018. The entire contents of these provisional applications are incorporated herein by reference.

BACKGROUND

This disclosure relates generally to near-eye-display systems, and more specifically to waveguide displays.

Near-eye light field displays typically project images directly into a user's eye, encompassing both near-eye displays (NEDs) and electronic viewfinders. Conventional near-eye displays (NEDs) generally have a display element that generates image light, using a multicolored pixel array (including, e.g., red, green, and blue pixels), that passes through one or more lenses before reaching the user's eyes. The image light may be propagated laterally by a waveguide or other optical system so that the display element does not need to be aligned directly with a user's eyes. Multicolored pixel arrays often use subpixels for each color, which increases the distance between pixels but also creates a slight shift in pixel location for each color. With NEDs, these distances between pixels and shifts in location can be perceivable by the user. Furthermore, it can be difficult to control light from a polychromatic display without creating chromatic aberrations. Additionally, NEDs in virtual reality systems and/or augmented reality systems may have design criteria to be compact, light-weight, and high-resolution, and there may often be trade-offs made in attempt to satisfy these criteria. Thus, conventional NEDs have not been entirely satisfactory in all these regards.

SUMMARY

As will be described in greater detail below, the instant disclosure describes apparatuses, systems, devices, and methods that may utilize one or more monochromatic emitter arrays to project monochromatic images toward a waveguide that may include one or more waveguide members. In some embodiments, the monochromatic images may be combined in the waveguide so that a desired polychromatic image is directed to the eyebox of a head-mounted display device.

In one example, an apparatus may include (1) a plurality of monochromatic emitter arrays, where each of the plurality of monochromatic emitter arrays has a plurality of emitters disposed in a two-dimensional configuration and emits a monochromatic image of a corresponding color, (2) a waveguide including (a) a top surface, (b) a bottom surface disposed opposite the top surface, (c) a coupling area that receives the monochromatic images, and (d) a decoupling area that projects a plurality of instances of a polychromatic image including a combination of the monochromatic images toward an eyebox through the bottom surface, and (3) an actuator system that produces lateral shifting of the plurality of instances of the polychromatic image between at least two positions relative to the waveguide configuration.

In some embodiments, the actuator system may alter an angular orientation of the plurality of monochromatic emitter arrays relative to the waveguide configuration.

In some examples, the apparatus may further include a projector device including the plurality of monochromatic emitter arrays, the projector device may further include at least one optical component that optically couples the monochromatic emitter arrays to the waveguide configuration, and the actuator system may alter an index of refraction of the at least one optical component to produce the lateral shifting of the plurality of instances of the polychromatic image between the at least two positions relative to the waveguide configuration.

In some examples, the apparatus may further include a projector device including the plurality of monochromatic emitter arrays, the projector device may further include at least one optical component that optically couples the monochromatic emitter arrays to the waveguide configuration, and the actuator system may alter at least one of an angular orientation or a translational position of the at least one optical component relative to the plurality of monochromatic emitter arrays to produce the lateral shifting of the plurality of instances of the polychromatic image between the at least two positions relative to the waveguide configuration.

In some embodiments, the actuator system may include a plurality of actuator components, where each of the plurality of actuator components is secured to a corresponding one of the plurality of monochromatic emitter arrays and configured to move the corresponding one of the plurality of monochromatic emitter arrays with respect to the waveguide configuration.

In some examples, the actuator system may include an actuator component secured to the plurality of monochromatic emitter arrays and configured to move the plurality of monochromatic emitter arrays as a unit with respect to the waveguide configuration.

In some embodiments, the lateral shifting between the at least two positions may correspond to a fraction of a distance between adjacent emitters of the plurality of monochromatic emitter arrays. In such embodiments, the apparatus may further include a controller where the at least two positions may include an integer number of positions, the lateral shifting between the at least two positions may include a reciprocal of the integer number of positions, and the controller may cause each of the plurality of monochromatic emitter arrays to produce a corresponding portion of the monochromatic image at each of the integer number of positions.

In some examples, the lateral shifting between the at least two positions may correspond to an integer number of a distance between adjacent emitters of each of the plurality of monochromatic emitter arrays. Further, in some embodiments, the integer number is one, the at least two positions include a first position and a second position, and the controller may cause each of the plurality of monochromatic emitter arrays to produce the corresponding monochromatic image at the first position and produce a shifted version of the corresponding monochromatic image at the second position. In some embodiments, the shifted version of the corresponding monochromatic image may compensate for a nonfunctional or underperforming emitter of an associated one of the plurality of monochromatic emitter arrays. Further, in some examples, the shifted version of the corresponding monochromatic image may compensate for the nonfunctional or underperforming emitter of the associated one of the plurality of monochromatic emitter arrays by altering at least one of a brightness level or a duty cycle of a fully functional emitter of the associated one of the plurality of monochromatic emitter arrays.

The apparatus, in some examples may further include a controller that causes at least one of the plurality of monochromatic emitter arrays to produce a corresponding monochromatic image between the at least two positions.

In one example, a method may include (1) directing, from each of a plurality of monochromatic emitter arrays, an emission of a monochromatic image of a corresponding color, where each of the plurality of monochromatic emitter arrays includes a plurality of emitters disposed in a two-dimensional configuration, (2) receiving, at a coupling area of a waveguide configuration, the monochromatic images, where the waveguide configuration further includes a top surface and a bottom surface disposed opposite the top surface, (3) projecting, from a decoupling area of the waveguide configuration, a plurality of instances of a polychromatic image including a combination of the monochromatic images toward an eyebox through the bottom surface, and (4) producing, using an actuator system, lateral shifting of the plurality of instances of the polychromatic image between at least two positions relative to the waveguide configuration.

In some embodiments, producing the lateral shifting may include altering an angular orientation of the plurality of monochromatic emitter arrays relative to the waveguide configuration.

In some example, producing the lateral shifting may include altering at least one of an index of refraction of at least one optical component of a projector device, the projector device may further include the plurality of monochromatic emitter array, and the at least one optical component may optically couple the monochromatic emitter arrays to the waveguide configuration.

In some embodiments, producing the lateral shifting may include altering an angular orientation or a translational position of at least one optical component of a projector device, the projector device may further include the plurality of monochromatic emitter arrays, and the at least one optical component may optically couple the monochromatic emitter arrays to the waveguide configuration.

In some examples, the actuator system may include a plurality of actuator components, where each of the plurality of actuator components is secured to a corresponding one of the plurality of monochromatic emitter arrays, and producing the lateral shifting may include moving, using the plurality of actuator components, the plurality of monochromatic emitter arrays with respect to the waveguide configuration.

In some embodiments, the actuator system may include an actuator component secured to the plurality of monochromatic emitter arrays, and producing the lateral shifting may include moving, using the actuator component, the plurality of monochromatic emitter arrays as a unit with respect to the waveguide configuration.

In one example, a system may include (1) a head-mounted display support configured for securing the system to a user, and (2) a display system secured to the head-mounted display support and including (a) a plurality of monochromatic emitter arrays, where each of the plurality of monochromatic emitter arrays has a plurality of emitters disposed in a two-dimensional configuration and emits a monochromatic image of a corresponding color, (b) a waveguide configuration including (i) a top surface, (ii) a bottom surface disposed opposite the top surface, and (iii) a decoupling area that projects a plurality of instances of a polychromatic image including a combination of the monochromatic images toward an eyebox through the bottom surface, and (c) an actuator system that produces lateral shifting of the plurality of instances of the polychromatic image between at least two positions relative to the waveguide configuration.

Features from any of the above-mentioned embodiments may be used in combination with one another according to the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
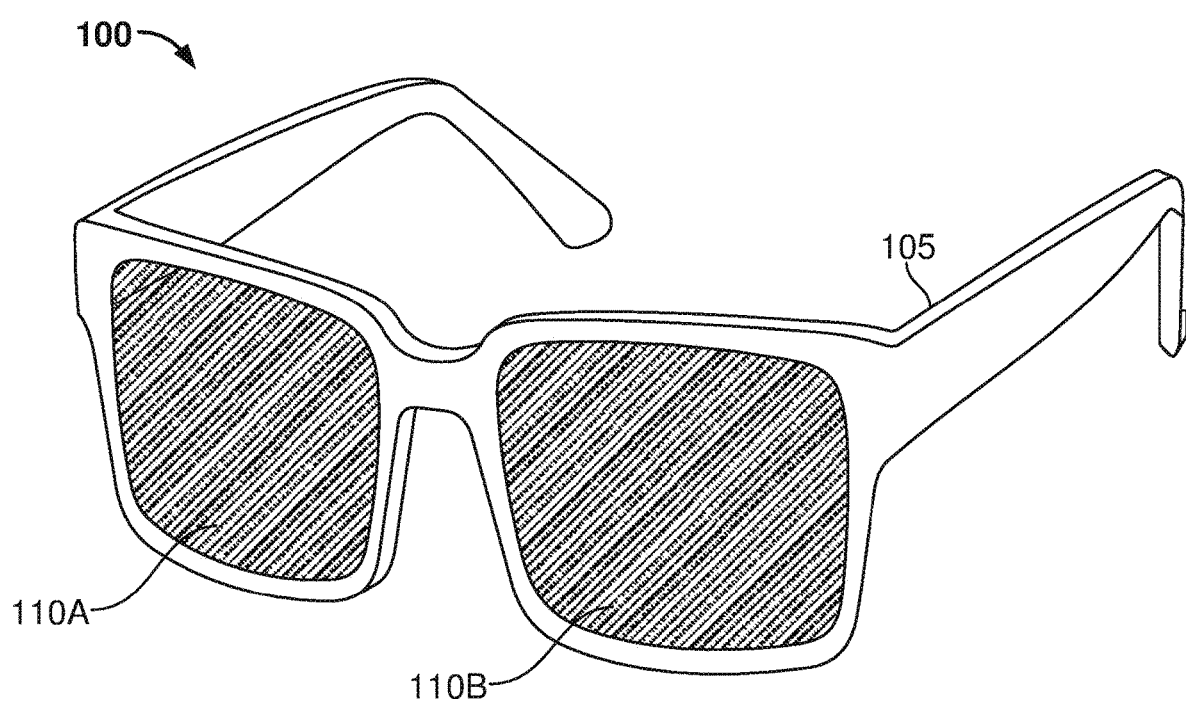
FIG. 1 is a diagram of an HMD that includes a NED, according to some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to improved NEDs that can be used in virtual reality (VR) or in augmented or mixed reality (AR/MR). Some NEDs may include a projector device including a first monochromatic emitter array having a plurality of emitters of a first color disposed in a two-dimensional configuration and a second monochromatic emitter array having a plurality of emitters of a second, different color disposed in a corresponding two-dimensional configuration. These two-dimensional configurations may be identical in some embodiments. The first and second monochromatic emitter arrays may be configured to emit images of the first and second colors toward a coupling area included in a waveguide configuration having one or more waveguide members. The waveguide configuration may combine the images to produce at least one polychromatic image directed toward an eyebox. In some examples, the waveguide configuration may be configured to project multiple replications of the polychromatic image toward the eyebox.

As will be explained in greater detail below, embodiments of the instant disclosure may provide for NEDs that are smaller and lighter than conventional NEDs, while still having a large eyebox or eyeboxes and a large FOV. To provide for less bulky, higher-resolution, and brighter near-eye displays, at least one monochromatic emitter array may be coupled to a waveguide/combiner. The emitter array, in some embodiments, may be a vertical-cavity surface-emitting laser (VCSEL) array or a microLED array having a high fill factor (e.g., by way of physical or optical means, such as via microlens or other refractory structures, or reflective structures), which may be close to 100%. In other embodiments, the emitter array can include other devices (e.g., direct emission light sources), including, but not limited to, semiconductor diodes, semiconductor laser diodes, an organic light-emitting diode (OLED) pixel array, a quantum dot array, a liquid-crystal display (LCD) with a variable backlight source, and the like. Projected light may first pass through a very small air gap between the emitter array and the waveguide before interacting with a coupling element, incorporated into the waveguide, that directs the light along a total internal reflection path. The path, in some examples, can include grating structures or other types of light decoupling structures that decouple portions of the light from the total internal reflection path to direct multiple instances of an image, "pupil replications," out of the waveguide at different places and toward an eyebox of an HMD.

Red, green, and blue monochromatic emitter arrays may be provided to reproduce full-color images when the respective red, green, and blue monochromatic images are combined by the waveguide. The emitter arrays may be coupled to the waveguide by three coupling elements, with one coupling element specially adapted for each wavelength, to produce full-color images when combined. The colors can be combined in a single waveguide or in separate waveguides designed for specific wavelengths, which may prevent crosstalk and allow for per-color optimization of each of the waveguides and associated gratings that provide for internal reflection and decoupling. Because the emitter arrays are each coupled to the waveguide at different positions, the area of full-color replication may be limited to the overlap of all three colors. However, the area of full-color replication may be larger than the eyebox.

In some embodiments, to help resolve the vergence-accommodation conflict (VAC), multiple waveguide/projector display devices can be positioned in series to present full-color images at different focus distances, such as at 0.3 diopters (D) and at 1.5 D, to the eye of the user. The display devices may be separated by an optical element, such as a lens, to provide for the different focus distances between each of the two displays. To optimize the difference in focus distances for a particular application or situation, the individual display devices stacks may be separated by a variable-focus lens, such as a common liquid or a liquid crystal lens that can be tuned in situ to achieve a desired difference in focus distance between the display devices.

To increase the FOV of the NED, multiple sets of emitter arrays can be coupled into a single waveguide configuration. For example, one NED having multiple sets of emitter arrays may be used for a user's left eye, while another NED having multiple sets of emitter arrays may be used for the user's right eye. The sets of emitter arrays for each NED can be coupled exactly 180 degrees apart from each other or may be coupled at any other angle relative to each other, in some embodiments, and at different angles with respect to each other in other embodiments. The sets of emitter arrays for each NED may be driven by separate drivers or controllers or may be driven by a single driver.

To improve resolution or to mitigate defects of individual emitters within an emitter array, disclosed systems and devices may include an actuation system that produces changes in relative position and/or angle between the emitter array or arrays and the waveguide, or by other methods described in greater detail below. By mechanically oscillating or dithering between two or more positions and/or angles, and/or by electronically shifting pixel locations of the emitted light between two or more positions on the emitter array itself, a single emitter array may act as multiple emitter arrays, projecting a different image or different portion of a single image from each position. In this way, images may have a greater resolution (e.g., a greater two-dimensional configuration of image pixels) than any single emitter array has emitters. Additionally, embodiments of the emitter arrays may include individual emitters having diameters less than or equal to about 5 μm. Because of this small size, producing an emitter array without any faulty or defective emitters may be difficult or impossible. Some embodiments may compensate for such faulty emitters by identifying their location or identifying an area or set of emitters that has a lower brightness or intensity over a period of time than is instructed when the emitter array is in a first position, and actuating a neighboring emitter or set of emitters when the emitter array is in a second position, since the second position may cause the neighboring emitter to be in the location previously occupied by the faulty emitter. Furthermore, in some examples, to mechanically oscillate or dither the emitters, small vibrations (e.g., in the frequency range of 20 Hz to 20 kHz) may be introduced to the emitters to compensate for visual artifacts, such as the screen door effect. Examples of mechanisms that may be employed to vibrate the emitters may include, but not limited to, one or more piezo structures, actuated liquid-crystal layers, and actuated diffraction gratings.

The following will provide, with reference to FIGS. 1-7D and 9A-14, detailed descriptions of an HMD and various components included in the NEDs of the HMD to achieve the benefits and improvements indicated above and elsewhere herein. The following will also provide, with reference to FIGS. 8 and 15, descriptions of methods and/or instructions associated with the NEDs described herein.

FIG. 1 is a diagram of a head-mounted display (HMD) 100 according to some embodiments. The HMD 100 may include a NED, which may include one or more display devices. The depicted embodiment includes a left display device 110A and a right display device 110B, which are collectively referred to as the display device 110. The display device 110 may present media to a user. Examples of media presented by the display device 110 include one or more images, a series of images (e.g., a video), audio, or some combination thereof. In some embodiments, audio may be presented via an external device (e.g., speakers and/or headphones) that receives audio information from the display device 110, a console (not shown), or both, and presents audio data based on the audio information. The display device 110 may generally be configured to operate as an AR NED, such that a user can see media projected by the display device 110 and see the real-world environment through the display device 110. However, in some embodiments, the display device 110 may be modified to also operate as a VR NED, a mixed reality (MR) NED, or some combination thereof. Accordingly, in some embodiments, the display device 110 may augment views of a physical, real-world environment with computer-generated elements (e.g., images, video, sound, etc.).

The HMD 100 shown in FIG. 1 may include a support or frame 105 that secures the display device 110 in place on the head of a user, in embodiments in which the display device 110 includes separate left and right displays. In some embodiments, the frame 105 may be a frame of eyewear glasses. As is described herein in greater detail, the display device 110, in some examples, may include a waveguide with holographic or volumetric Bragg gratings. In some embodiments, the gratings may be generated by a process of applying one or more dopants or photosensitive media to predetermined portions of the surface of the waveguide and subsequent ultraviolet (UV) light exposure or application of other activating electromagnetic radiation.

Figure 2:
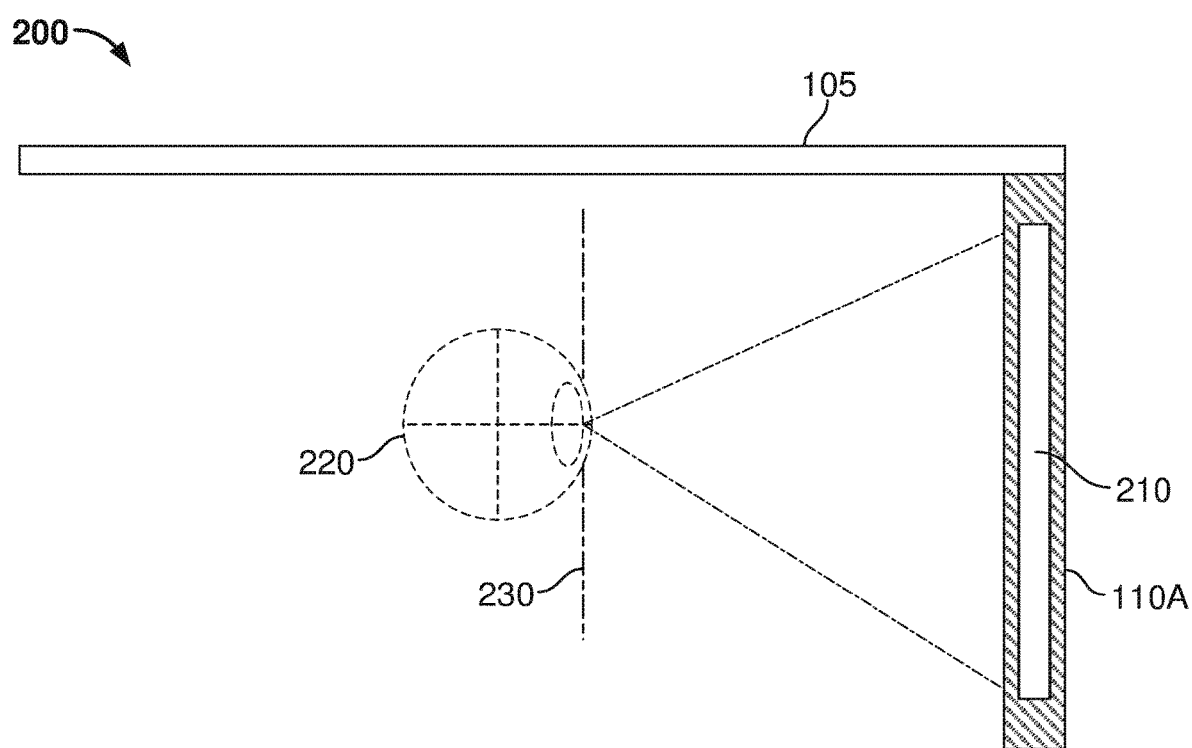
FIG. 2 is a cross-section of the HMD illustrated in FIG. 1, according to some embodiments.

FIG. 2 is a cross-section 200 of the HMD 100 and the display device 110A illustrated in FIG. 1, according to some embodiments. The display device 110 may include at least one waveguide configuration 210. FIG. 2 shows an eyebox 230, which is a location where the eye 220 is positioned when the user wears the display device 110. As long as the eye 220 is aligned with the eyebox 230, the user may be able to see a full-color image or a pupil replication directed toward the eyebox 230 by the waveguide configuration 210. The waveguide configuration 210 may produce and direct many pupil replications to the eyebox 230. For purposes of illustration, FIG. 2 shows the cross-section 200 associated with a single eye 220 and single waveguide configuration 210. In some alternative embodiments, another waveguide configuration 210 (which may be separate from the waveguide configuration 210 shown in FIG. 2) may provide image light to an eyebox located at another eye 220 of the user.

The waveguide configuration 210, as illustrated below in FIG. 2, may be configured to direct the image light to an eyebox located proximate to the eye 220. The waveguide configuration 210 may be composed of one or more materials (e.g., plastic, glass, etc.) with one or more refractive indices that effectively minimize the weight and widen an FOV of the display device 110. In alternate configurations, the display device 110 may include one or more optical elements between the waveguide configuration 210 and the eye 220. The optical elements may act to, e.g., correct aberrations in image light emitted from the waveguide configuration 210, magnify image light emitted from the waveguide configuration 210, make some other optical adjustment of image light emitted from the waveguide configuration 210, or perform some combination thereof. Examples of optical elements may include an aperture, a Fresnel lens, a refractive (e.g., convex and/or concave) lens, a reflective surface, a filter, or any other suitable optical element that affects image light. The waveguide configuration 210 may include a waveguide with one or more sets of Bragg gratings.

In some implementations, the lenses described herein can include different designs to meet certain design specifications, including, but not limited to, a viewing angle, a maximum aperture, a resolution, a distortion, a color correction, a back focal distance, and the like. The lens or lenses may include a cylindrical lens, an anamorphic lens, a Fresnel lens, and/or a gradient index lens, and the like. The lens can include a superlens having at least a portion having a negative index of refraction. The lens can include lenses having various shapes.

In some implementations, the lens can include various materials. For example, the lens may include glass. In another example, the lens can include a plastic material. For example, the lens can include a CR-39 lens material, a urethane-based polymer, or a polycarbonate material.

Figure 3:
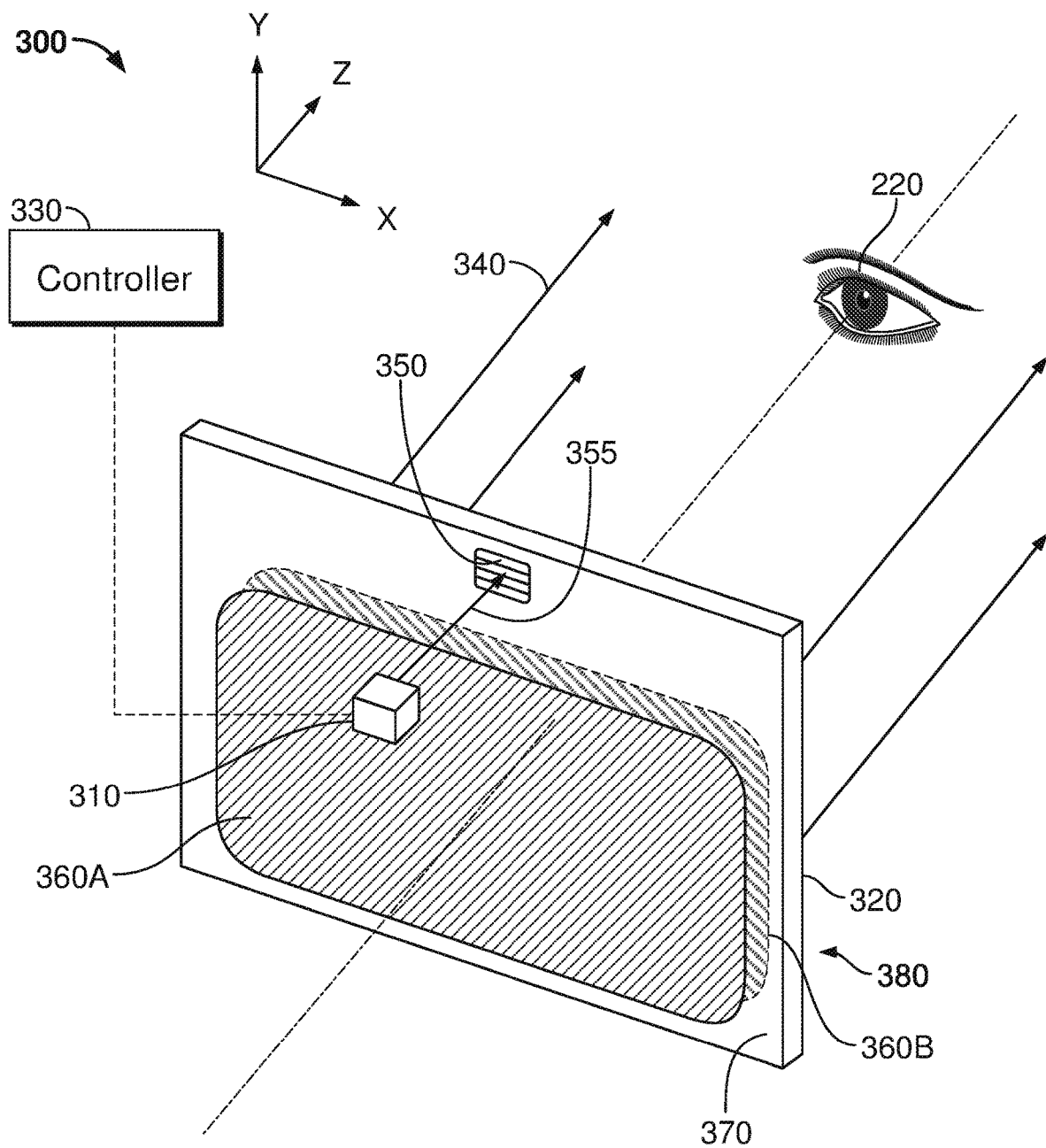
FIG. 3 is an isometric view of a NED having a waveguide configuration, according to some embodiments.

FIG. 3 illustrates an isometric view of a display system or NED 300, according to some embodiments. In some embodiments, the NED 300 may be a component of the HMD 100. In alternate embodiments, the NED 300 may be part of another HMD or other system that directs image light to a particular location.

The NED 300 may include a projector device 310, a waveguide 320, and a controller 330. For purposes of illustration, FIG. 3 shows the NED 300 associated with a single eye 220, but in some embodiments another waveguide that is completely separate or partially separate from the NED 300 may provide image light to another eye of the user. In a partially separate system, one or more components may be shared between the waveguides for each eye. In some instances, a single waveguide 320 may provide image light to both eyes of the user. Also, in some examples, the waveguide 320 may be one of multiple waveguides of a waveguide configuration, as is described more fully below.

The projector device 310 may generate light including one or more two-dimensional monochromatic images. The projector device 310 may include one or more monochromatic optical sources and an optics system, as is further described herein with regard to FIGS. 4A-C and 5A-C. The projector device 310 may generate and project image light 355, including at least one two-dimensional image, to a coupling area 350 located on a top surface 370 of the waveguide 320. The image light 355 may propagate along a dimension or axis toward the coupling area 350.

The waveguide 320 may be an optical waveguide that outputs two-dimensional images in image light directed to the eye 220 of a user. The waveguide 320 may receive the image light 355 at a coupling area 350, which may include one or more coupling elements located on the top surface 370 and/or within the body of the waveguide 320, and may guide the received image light 355 to a propagation area of the waveguide 320. A coupling element of the coupling area 350 may be, e.g., a diffraction grating, a holographic grating, one or more cascaded reflectors, one or more prismatic surface elements, an array of holographic reflectors, a metamaterial surface, or some combination thereof. An exemplary coupling element may be a grating having a pitch of approximately 300 nm to approximately 600 nm. In some configurations, each of the coupling elements in the coupling area 350 may have substantially the same area along the X-axis and the Y-axis dimensions and may be separated by a distance along the Z-axis (e.g., on the top surface 370 and the bottom surface 380, or both on the top surface 370 but separated by an interfacial layer (not shown), or on the bottom surface 380 and separated with an interfacial layer or both embedded into the body of the waveguide 320 but separated with the interfacial layer). The coupling area 350 may be understood as extending from the top surface 370 to the bottom surface 380. The coupling area 350 may redirect received image light, according to a first grating vector, into a propagation area of the waveguide 320 formed in the body of the waveguide 320 between decoupling elements.

A decoupling element 360A may redirect the totally internally reflected image light from the waveguide 320 such that it may be decoupled through a decoupling element 360B. The decoupling element 360A may be part of, affixed to, or formed in, the top surface 370 of the waveguide 320. The decoupling element 360B may be part of, affixed to, or formed in, the bottom surface 380 of the waveguide 320, such that the decoupling element 360A is opposed to the decoupling element 360B with a propagation area extending therebetween. In some configurations, there may be an offset between the opposed decoupling elements along the X-axis and/or Y-axis. The decoupling elements 360A and 360B may be, e.g., a diffraction grating, a holographic grating, a volumetric Bragg grating, one or more cascaded reflectors, one or more prismatic surface elements, an array of holographic reflectors, etc., and together may form a decoupling area.

In some embodiments, each of the decoupling elements 360A may have substantially the same area along the X-axis and the Y-axis dimensions and may be separated by a distance along the Z-axis (e.g., on the top surface 370 and the bottom surface 380, or both on the top surface 370 but separated with an interfacial layer (not shown), or on the bottom surface 380 and separated with an interfacial layer or both embedded into the waveguide body of the waveguide 320 but separated with the interfacial layer). The decoupling element 360A may have an associated second grating vector, and the decoupling element 360B may have an associated third grating vector.

While particular locations and configurations of the projector device 310, the coupling area 350, and the decoupling elements 360A and 360B relative to the waveguide 320 are depicted in FIG. 3, other locations configurations described in greater detail below, as well as other not specifically described herein, may be employed in other examples.

In some embodiments, an orientation and/or position of the image light 340 exiting from the waveguide 320 may be controlled by changing an orientation of the image light 355 entering the coupling area 350. To that end, in some embodiments, an orientation of the projector device 310 relative to the waveguide 320 may alter the orientation and/or position of the image light 355 entering the coupling area 350. Also, in some examples, an orientation and/or position of one or more optical components (e.g., lenses) of the projector device 310 relative to a monochromatic emitter array of the projector device 310 may be controllably modified to alter the orientation and/or position of the image light 355 entering the coupling area 350. The pitch of the decoupling element 360A and/or the decoupling element 360B may be approximately 200 nm to approximately 700 nm. In some configurations, the coupling area 350 couples the image light into the waveguide 320 and the image light propagates along the plane of the waveguide 320. The decoupling element 360A may receive image light from the coupling area 350 covering a first portion of the first angular range emitted by the projector device 310 and may diffract the received image light to another dimension. The decoupling element 360B may diffract a two-dimensional expanded image toward the eyebox.

The coupling area 350 and the decoupling area defined by the decoupling element 360A and the decoupling element 360B may be designed such that a sum of their respective grating vectors is less than a threshold value, which may be close to or equal to zero such that light exits the waveguide 320 at approximately the same angle at which it enters. Accordingly, the image light 355 entering the waveguide 320 may be propagated in the same direction when it is output as image light 340 from the waveguide 320. The image light 340 may include multiple pupil replications or copies of the input image light 355. The location of the coupling area 350 relative to the decoupling elements 360A and 360B as shown in FIG. 3 is only an example. In other embodiments, the location of the coupling area 350 could be on any other portion of the waveguide 320 (e.g., a top edge of the top surface 370 or a bottom edge of the top surface 370). In some embodiments, the NED 300 may include a plurality of projector devices 310 and/or a plurality of coupling areas 350 to increase the FOV and/or eyebox further. Also, in some embodiments, the decoupling elements 360A and 360B may overlap only partially or be completely separated.

The waveguide 320 may include a waveguide body with the top surface 370 and a bottom surface 380, extending in X- and Y-directions, that are opposite to each other. The waveguide 320 may be composed of one or more materials that facilitate total internal reflection of the image light 355. For example, the waveguide 320 may be composed of, e.g., silicone, plastic, glass, ceramics, or polymers, or some combination thereof. For example, the waveguide 320 can include a dielectric or other material that is substantially transparent in the visible spectrum. An optical coating may be used in connection with the waveguide 320. The optical coating may be a dielectric coating that can include thin layers of materials such as magnesium fluoride, calcium fluoride, and various metal oxides. By choice of the composition, thickness, and number of these layers, the reflectivity and transmissivity of the coating can be tuned.

The waveguide 320 may have a relatively small form factor. For example, the waveguide 320 may be approximately 50 mm wide along the X-dimension, 30 mm long along the Y-dimension, and 0.3-2 mm thick along the Z-dimension. In other embodiments, the waveguide 320 may be approximately 150 mm wide along the X-dimension and 100 mm long along the Y-dimension, with a thickness ranging between 0.1-2 mm along the Z-dimension.

In some embodiments, one or more controllers (such as the controller 330) may control the operations of the projector device 310. The controller 330 may generate display instructions for the projector device 310. The display instructions may include instructions to project or emit one or more monochromatic images. In some embodiments, display instructions may include a monochromatic image file (e.g., bitmap). The display instructions may be received from, e.g., a processing device included in the HMD 100 of FIG. 1 or in wireless or wired communication therewith. As described herein, the display instructions may further include instructions for moving the projector device 310, or individual emitter arrays thereof, for moving the waveguide 320 by activating an actuation system. The controller 330 may include a combination of hardware, software, and/or firmware not explicitly shown herein so as not to obscure other aspects of the disclosure.

In some embodiments, the waveguide 320 may output the expanded image light 340 to the user's eye 220 with a relatively large FOV. For example, the expanded image light 340 may be output to the user's eye 220 with a diagonal FOV (in X- and Y-directions) of at least 60 degrees. The waveguide 320 may be configured to provide an eyebox with a length of at least 20 mm and a width of at least 10 mm, in X- and Y-directions, respectively. Generally, the horizontal FOV may be larger than the vertical FOV. For example, the waveguide 320 may have an aspect ratio of 16:9, 16:10, 16:13, or some other aspect ratio.

Figure 4A:
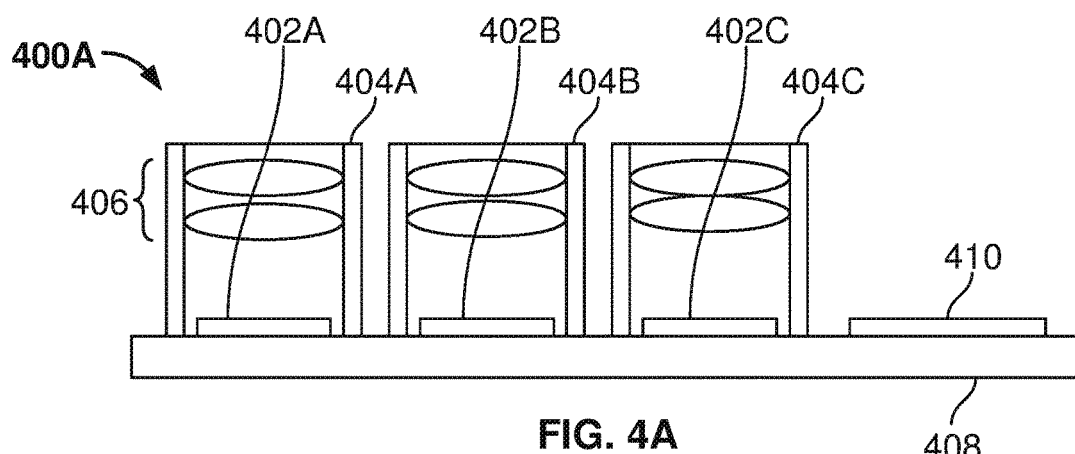
FIGS. 4A, 4B, and 4C are cross-sectional views of projector devices that may be included in the display system of FIG. 3, according to some embodiments.
Figure 4B:
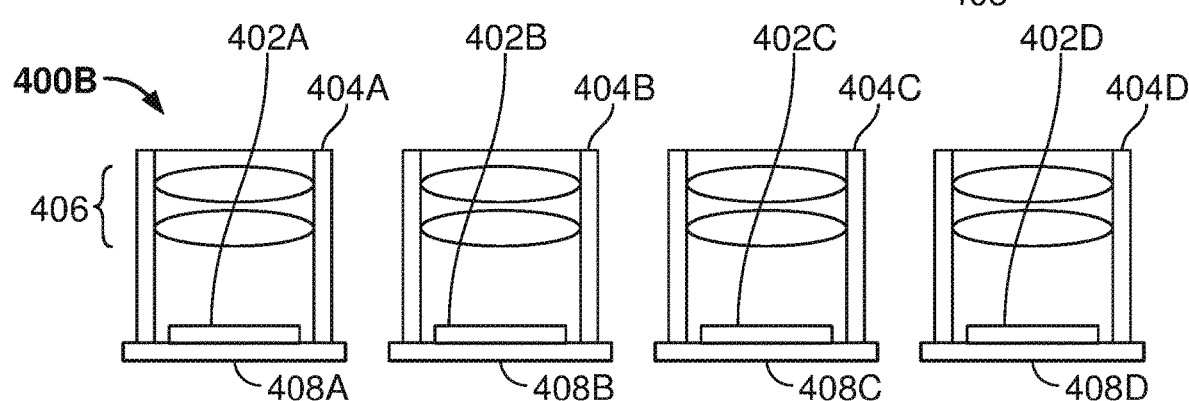
Figure 4C:
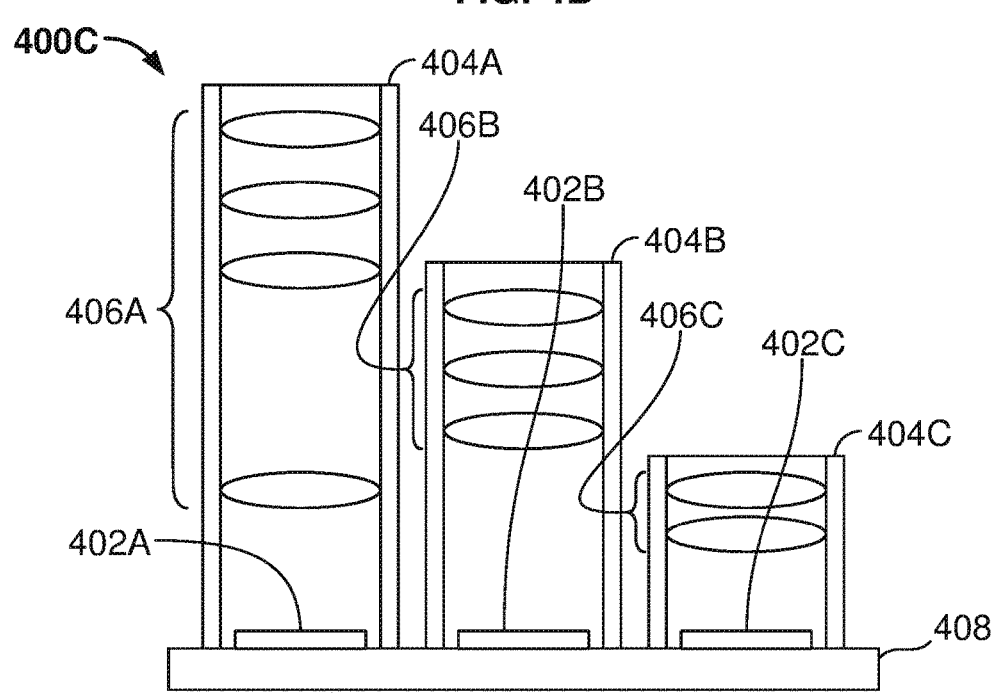

FIGS. 4A, 4B, and 4C are cross-sectional views of projector devices that may be included in the NED 300 of FIG. 3 as the projector device 310, according to some embodiments. The projector device 400A of FIG. 4A may include a plurality of two-dimensional monochromatic emitter arrays. As shown, the projector device 400A may include a first emitter array 402A, a second emitter array 402B, and a third emitter array 402C, each of which may be disposed in an array housing 404A, 404B, and 404C, respectively. For convenience, the emitter arrays 402A-C may be referred to collectively as emitters arrays 402 and also individually as an emitter array 402. Similarly, the array housings 404A-C may be referred to collectively as housings 404 or individually as a housing 404. Each of the housings 404 may include an optical system 406, which may include one or more optical components, such as lenses (e.g., glass, plastic, or metamaterial lenses), prisms, filters, etc., which may alter the direction or control other characteristics of light emitted by the emitter arrays 402. As shown, the emitter arrays 402 may be secured to a common structure, such as an application-specific integrated circuit (ASIC), a printed circuit board (PCB) 408, backplane, or other structure, which may include leads that connect the emitter arrays 402 to a controller 410. In other embodiments, the controller 410 may be disposed elsewhere within or on the HMD 100, secured either directly or indirectly to the frame 105.

Each of the emitter arrays 402 may be a monochromatic emitter array having a two-dimensional configuration of individual emitters of a single color. As described herein, a green color may be understood as a wavelength range from about 500 nm to about 555 nm. Further, as described herein, a red color may be understood as a wavelength range from about 622 nm to about 780 nm. A blue color may be understood as a wavelength range from about 440 nm to about 492 nm. Accordingly, a monochromatic emitter array 402 may emit light within a narrow wavelength range, rather than at a single wavelength, in some embodiments. For example, a monochromatic emitter array 402 may emit within a wavelength range of 5-10 nm in width, such as by way of using one or more chromatic filters, which may facilitate a simplified projection lens design with reduced achromatic performance requirements. According to certain examples, the emitter array 402A may include only red-light emitters, the emitter array 402B may include only green-light emitters, and the emitter array 402C may include only blue-light emitters. Under the direction of the controller 410, each of the emitter arrays 402A-C may produce a monochromatic image according to the color produced by its emitters. Accordingly, the three monochromatic emitter arrays 402A-C may simultaneously emit three monochromatic images (e.g., a red image, a green image, and a blue image) toward the coupling area 350 of FIG. 3. The three monochromatic images may be extracted from a full-color image. For example, the controller 410 may receive a full-color image to be displayed to a user and then decompose the full-color into multiple monochromatic images, such a red image, a green image, and a blue image. As described herein, the waveguide configuration 320 may combine (or recombine) the three monochromatic images to produce a full-color image or a polychromatic image, which may then be directed as the light 340 toward the eye 220. In yet other examples, one or more emitter arrays 402A-C may produce light of multiple wavelengths, ranges of wavelengths, or other forms of light other than monochromatic light.

In some embodiments, a calibration and/or alignment system (not shown in FIG. 4A) may be employed to align the multiple monochromatic images (e.g., via mechanical movement of one or more of the monochromatic emitter arrays 402A-C or software movement of one or more of the monochromatic images by one or more pixels as emitted from their associated monochromatic emitter arrays 402A-C) to produce a desired or intended, properly aligned polychromatic image.

FIG. 4B depicts a projector device 400B in which a plurality of emitter arrays may not be fixed with respect to each other by being secured to a common ASIC, PCB, backplane, or other structure. Instead, each of the emitter arrays 402 may be secured to an individual PCB 408A, 408B, 408C, and 408D. In other embodiments, ASICs or other individual structures, or some combination thereof, may be employed in place of one or more of the PCBs 408A-D. The projector device 400B may include a fourth monochromatic emitter array 402D (or other emitter array emitting light that is not strictly monochromatic) disposed within a fourth array housing 404D. In some embodiments, the emitter array 402D may be a white-light emitter array, such that each emitter of the emitter array 402D produces only white light. In some embodiments, the white-light emitter array may be used to produce white image pixels that would otherwise be produced by a combination of the emitter arrays 402A-C. The white-light emitter array may produce light that is perceived by a viewer as white. In some embodiments, the white-light emitter array may include blue microLEDs with a yellow phosphor coating (e.g., Cerium (III)-doped yttrium aluminum garnet (Ce:YAG)). The combination of the blue emitters and the phosphor may provide light that appears white to the user. This may reduce power consumption by substituting the power requirements of a single emitter array for a combination of three-emitter arrays. Additionally or alternatively, such a monochromatic image produced by the emitter array 402D may be a brightness or saturation image that does not substantially alter the colors of the polychromatic image produced by combining the three images for the emitter arrays 402A-C. In some embodiments, the white-light emitter array may be a micro-OLED emitter array that produces a broad visible emission spectrum that may be perceived as white. In other examples, the fourth monochromatic emitter array 402D may emit another color (e.g., cyan or other color between green and blue) may be more efficient overall, and may facilitate use of the monochromatic emitter arrays 402A-D as a four-color primary system.

FIG. 4C depicts a projector device 400C in which a height of the emitter arrays 402 may vary from emitter array to emitter array. As shown, the array housing 404A may be higher or taller than the array housing 404B, which in turn may be higher or taller than the array housing 404C. The differences in height may permit differences in the optical system included in each housing. Accordingly, the optical system 406A may have more or larger components or may operate at a higher power level than the optical system 406B, which in turn may have more components and/or a lower power level than the optical system 406C. For example, the emitter array 402A of FIG. 4C may be a green image emitter array. The larger size of the green emitter array 402A may provide for greater heat dissipation and/or improved optics. This may enable the green image to be the brightest of the three monochromatic images.

Figure 5A:
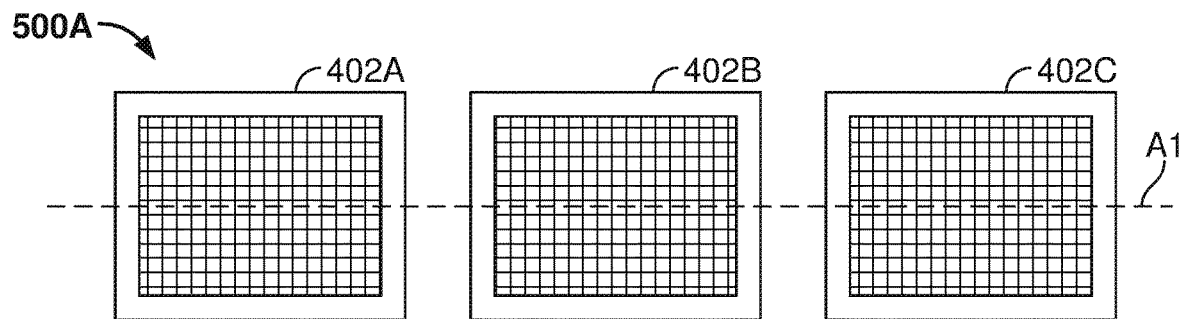
FIGS. 5A, 5B, and 5C are top views of emitter arrays that may be included in the projector devices of FIGS. 4A-C, according to some embodiments.
Figure 5B:
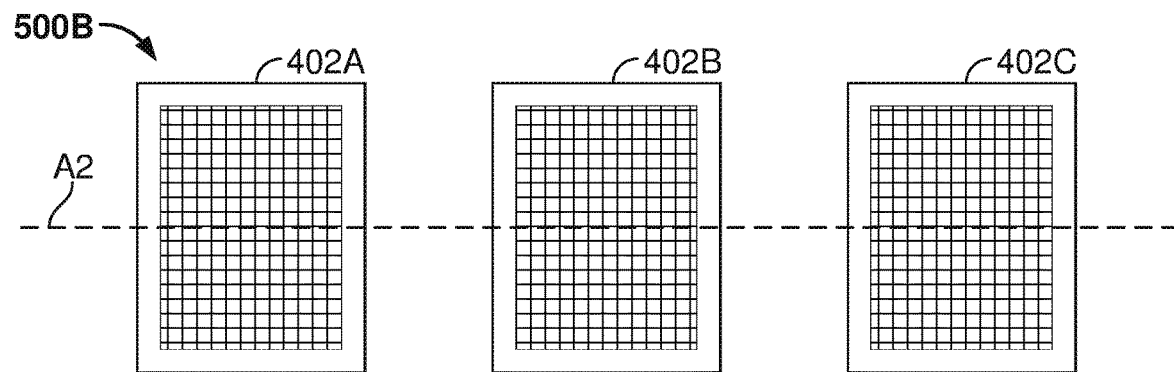
Figure 5C:
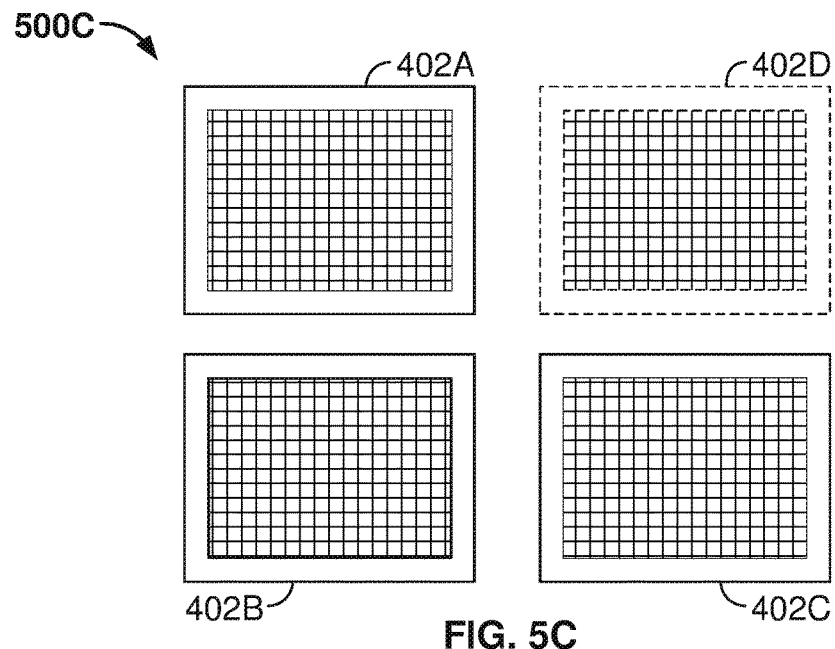

FIGS. 5A, 5B, and 5C are top views of emitter array configurations that may be included in the projector device 310 of FIG. 3, according to some embodiments. The configuration 500A shown in FIG. 5A is a linear configuration of the emitter arrays 402A-C of FIG. 4A along the axis A1. This particular linear configuration may be arranged according to a longer side of the rectangular emitter arrays 402. While the emitter arrays 402 may have a square configuration of emitters in some embodiments, other embodiments may include a rectangular configuration of emitters. In yet other examples, the emitter arrays 402A-C may have other configurations (e.g., oval, circular, or otherwise rounded in some fashion) while defining a first dimension (e.g., a width) and a second dimension (e.g., length) orthogonal to the first direction, with one dimension being either equal or unequal to each other. In FIG. 5B, the emitter arrays 402A-C may be disposed in a linear configuration 500B according to a shorter side of the rectangular emitter arrays 402, along the axis A2. FIG. 5C shows a triangular configuration of the emitter arrays 402A-C in which the centers of the emitter arrays 402 form a non-linear (e.g., triangular) shape or configuration. Some embodiments of the configuration 500C of FIG. 5C may further include a white-light emitter array 402D, such that the emitter arrays 402 are in a rectangular or square configuration. The emitter arrays 402 may have a two-dimensional emitter configuration with more than 1000 by 1000 emitters, in some embodiments. Various other configurations are also within the scope of the present disclosure.

Figure 6A:
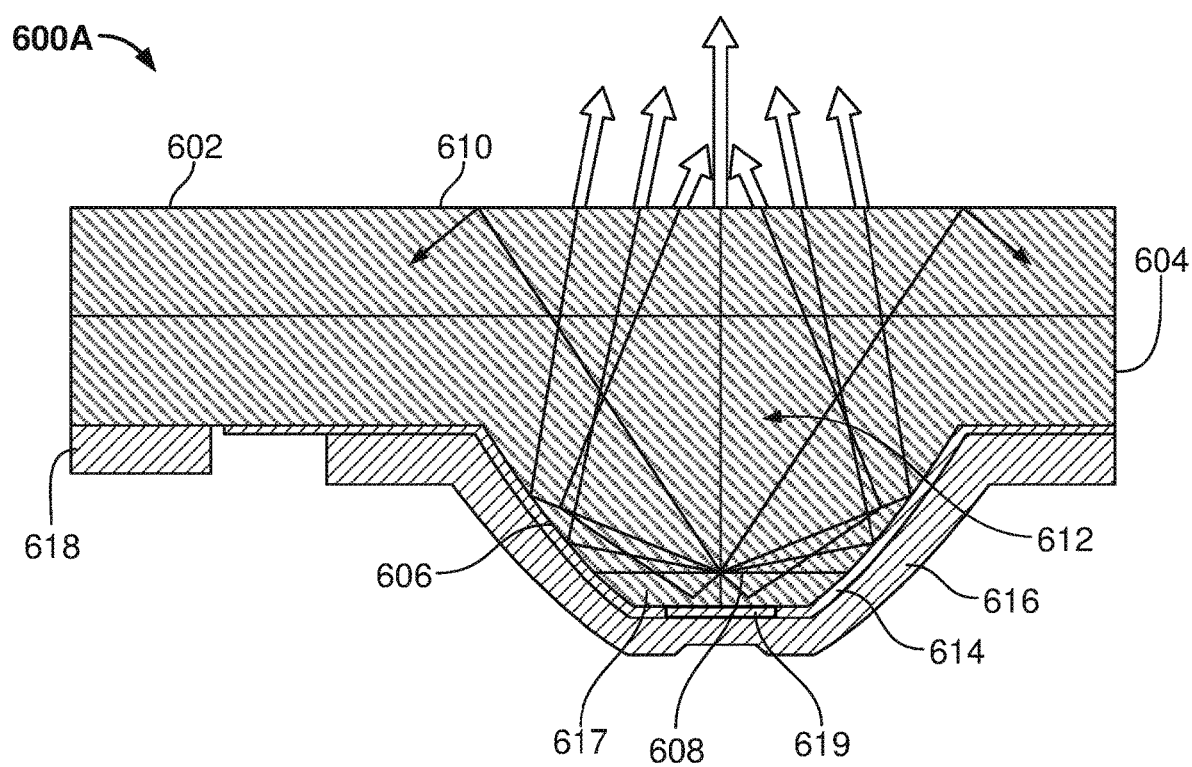
FIGS. 6A and 6B are schematic cross-sectional diagrams of a microLED included in the emitters arrays of FIGS. 4A-C and 5A-C, according to some embodiments.
Figure 6B:
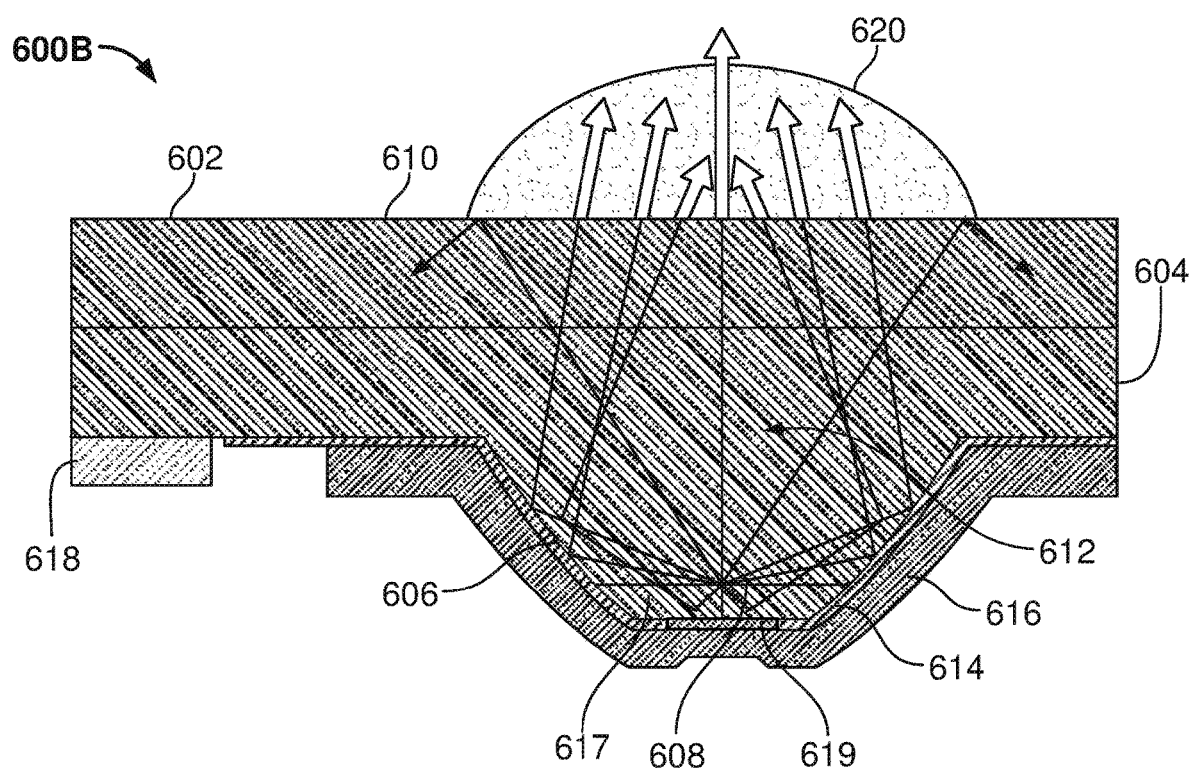

FIGS. 6A and 6B are schematic cross-sectional diagrams of an example microLED 600A that may be included as an individual emitter in the emitter arrays 402 of FIGS. 4A-C and 5A-C, according to some embodiments. FIG. 6A shows a schematic cross-section of a microLED 600A. A "microLED" may be a particular type of LED having a small active light emitting area (e.g., less than 2,000 $\mu m^2$ in some embodiments, less than 20 $\mu m^2$ or less than 10 $\mu m^2$ in other embodiments). In some embodiments, the emissive surface of the microLED 600A may have a diameter of less than approximately 5 µm, although smaller (e.g., 2 µm) or larger diameters for the emissive surface may be utilized in other embodiments. The microLED 600A may also have collimated or non-Lambertian light output, in some examples, which may increase the brightness level of light emitted from a small active light-emitting area.

The microLED 600A may include, among other components, an LED substrate 602 with a semiconductor epitaxial layer 604 disposed on the substrate 602, a dielectric layer 614 and a p-contact 619 disposed on the epitaxial layer 604, a metal reflector layer 616 disposed on the dielectric layer 614 and p-contact 619, and an n-contact 618 disposed on the epitaxial layer 604. The epitaxial layer 604 may be shaped into a mesa 606. An active light-emitting area 608 may be formed in the structure of the mesa 606 by way of a p-doped region 617 of the epitaxial layer 604.

The substrate 602 may include transparent materials such as sapphire or glass. In one embodiment, the substrate 602 may include silicon, silicon oxide, silicon dioxide, aluminum oxide, sapphire, an alloy of silicon and germanium, indium phosphide (InP), and the like. In some embodiments, the substrate 602 may include a semiconductor material (e.g., monocrystalline silicon, germanium, silicon germanium (SiGe), and/or a III-V based material (e.g., gallium arsenide), or any combination thereof. In various embodiments, the substrate 602 can include a polymer-based substrate, glass, or any other bendable substrate including two-dimensional materials (e.g., graphene and molybdenum disulfide), organic materials (e.g., pentacene), transparent oxides (e.g., indium gallium zinc oxide (IGZO)), polycrystalline III-V materials, polycrystalline germanium, polycrystalline silicon, amorphous III-V materials, amorphous germanium, amorphous silicon, or any combination thereof. In some embodiments, the substrate 602 may include a III-V compound semiconductor of the same type as the active LED (e.g., gallium nitride). In other examples, the substrate 602 may include a material having a lattice constant close to that of the epitaxial layer 604.

The epitaxial layer 604 may include gallium nitride (GaN) or gallium arsenide (GaAs). The active layer 608 may include indium gallium nitride (InGaN). The type and structure of semiconductor material used may vary to produce microLEDs that emit specific colors. In one embodiment, the semiconductor materials used can include a III-V semiconductor material. III-V semiconductor material layers can include those materials that are formed by combining group III elements (Al, Ga, In, etc.) with group V elements (N, P, As, Sb, etc.). The p-contact 619 and n-contact 618 may be contact layers formed from indium tin oxide (ITO) or another conductive material that can be transparent at the desired thickness or arrayed in a grid-like pattern to provide for both good optical transmission/transparency and electrical contact, which may result in the microLED 600A also being transparent or substantially transparent. In such examples, the metal reflector layer 616 may be omitted. In other embodiments, the p-contact 619 and the n-contact 618 may include contact layers formed from conductive material (e.g., metals) that may not be optically transmissive or transparent, depending on pixel design.

In some implementations, alternatives to ITO can be used, including wider-spectrum transparent conductive oxides (TCOs), conductive polymers, metal grids, carbon nanotubes (CNT), graphene, nanowire meshes, and thin-metal films. Additional TCOs can include doped binary compounds, such as aluminum-doped zinc-oxide (AZO) and indium-doped cadmium-oxide. Additional TCOs may include barium stannate and metal oxides, such as strontium vanadate and calcium vanadate. In some implementations, conductive polymers can be used. For example, a poly(3,4- ethylenedioxythiophene) PEDOT: poly(styrene sulfonate) PSS layer can be used. In another example, a poly(4,4-dioctyl cyclopentadithiophene) material doped with iodine or 2,3-dichloro-5,6-dicyano-1,4-benzoquinone (DDQ) can be used. The example polymers and similar materials can be spin-coated in some example embodiments.

In some embodiments, the p-contact 619 may be of a material that forms an ohmic contact with the p-doped region 617 of the mesa 606. Examiner of such materials may include, but are not limited to, palladium, nickel oxide deposited as a NiAu multilayer coating with subsequent oxidation and annealing, silver, nickel oxide/silver, gold/zinc, platinum gold, or other combinations that form ohmic contacts with p-doped III-V semiconductor material.

The mesa 606 of the epitaxial layer 604 may have a truncated top on a side opposed to a substrate light emissive surface 610 of the substrate 602. The mesa 606 may also have a parabolic or near-parabolic shape to form a reflective enclosure or parabolic reflector for light generated within the microLED 600A. However, while FIG. 6A depicts a parabolic or near-parabolic shape for the mesa 606, other shapes for the mesa 606 are possible in other embodiments. The arrows indicate how light 612 emitted from the active layer 608 may be reflected off the internal walls of the mesa 606 toward the light emissive surface 610 at an angle sufficient for the light to escape the microLED 600A (i.e., outside an angle of total internal reflection). The p-contact 619 and the n-contact 618 may electrically connect the microLED 600A to a substrate.

The parabolic-shaped structure of the microLED 600A may result in an increase in the extraction efficiency of the microLED 600A into low illumination angles when compared to unshaped or standard LEDs. Standard LED dies may generally provide an emission full width at half maximum (FWHM) angle of 120°. In comparison, the microLED 600A can be designed to provide controlled emission angle FWHM of less than standard LED dies, such as around 60°. This increased efficiency and collimated output of the microLED 600A can enable improvement in overall power efficiency of the NED, which can be important for thermal management and/or battery life.

The microLED 600A may include a circular cross-section when cut along a horizontal plane, as shown in FIG. 6A. However, the microLED 600A cross-section may be non-circular in other examples. The microLED 600A may have a parabolic structure etched directly onto the LED die during the wafer processing steps. The parabolic structure may include the active light-emitting area 608 of the microLED 600A to generate light, and the parabolic structure may reflect a portion of the generated light to form the quasi-collimated light 612 emitted from the substrate light emissive surface 610. In some examples, the optical size of the microLED 600A may be smaller than or equal to the active light-emitting area 608. In other embodiments, the optical size of the microLED 600A may be larger than the active light-emitting area 608, such as through a refractive or reflective approach, to improve usable brightness of the microLED 600A, including any chief ray angle (CRA) offsets to be produced by the emitter array 402.

FIG. 6B depicts a microLED 600B that is similar in many respects to the microLED 600A of FIG. 6A. The microLED 600B may further include a microlens 620, which may be formed over the parabolic structure. In some embodiments, the microlens 620 may be formed by applying a polymer coating over the microLED 600A, patterning the coating, and reflowing the coating to achieve the desired lens curvature. The microlens 620 may be disposed over an emissive surface to alter a chief ray angle of the microLED 600B. In another embodiment, the microlens 620 may be formed by depositing a microlens material above the microLED 600A (for example, by a spin-on method or a deposition process). For example, a microlens template (not shown) having a curved upper surface can be patterned above the microlens material. In some embodiments, the microlens template may include a photoresist material exposed using a distributing exposing light dose (e.g., for a negative photoresist, more light is exposed at a bottom of the curvature and less light is exposed at a top of the curvature), developed, and baked to form a rounding shape. The microlens 620 can then be formed by selectively etching the microlens material according to the microlens template. In some embodiments, the shape of the microlens 620 may be formed by etching into the substrate 602. In other embodiments, other types of light-shaping or light-distributing elements, such as an annular lens, Fresnel lens, or photonic crystal structures, may be used instead of microlenses.

In some embodiments, microLED arrangements other than those specifically discussed above in conjunction with FIGS. 6A and 6B may be employed as a microLED in emitter array 402. For example, the microLED may include isolated pillars of epitaxially grown light-emitting material surrounded by a metal reflector. The pixels of the emitter array 402 may also include clusters of small pillars (e.g., nanowires) of epitaxially grown material that may or may not be surrounded by reflecting material or absorbing material to prevent optical crosstalk. In some examples, the microLED pixels may be individual metal p-contacts on a planar, epitaxially grown LED device, in which the individual pixels may be electrically isolated using passivation means, such as plasma treatment, ion-implantation, or the like. Such devices may be fabricated with light extraction enhancement methods, such as microlenses, diffractive structures, or photonic crystals. Other processes for fabricating the microLEDs of the dimensions noted above other than those specifically disclosed herein may be employed in other embodiments.

FIGS. 7A, 7B, 7C, and 7D are cross-sectional views of display systems or NEDs that include a projector device and a waveguide configuration, according to some embodiments. The embodiments depicted in FIGS. 7A-D may provide for the projection of many image replications (e.g., pupil replications), while other embodiments may instead provide for decoupling a single image projection at a single point. Accordingly, additional embodiments of disclosed NEDs may provide for a single decoupling element. Outputting a single image toward the eyebox 230 may preserve the intensity of the coupled image light. Some embodiments that provide for decoupling at a single point may further provide for steering of the output image light. Such pupil-steering NEDs may further include systems for eye tracking to monitor a user's gaze. Some embodiments of the waveguide configurations that provide for pupil replication, as described herein, may provide for one-dimensional replication, while other embodiments may provide for two-dimensional replication. As illustrated in FIGS. 7A-D, two-dimensional pupil replication may include directing light into and outside the plane of each figure. The figures are presented in a simplified format. The detected gaze of the user may be used to adjust the position and/or orientation of the emitter arrays individually or the projector device 750 as a whole and/or to adjust the position and/or orientation of the waveguide configuration. Some exemplary actuation systems for adjusting position and/or orientation of display system components to steer an output image pupil are described in greater detail below with respect to FIGS. 11A-D.

Figure 7A:
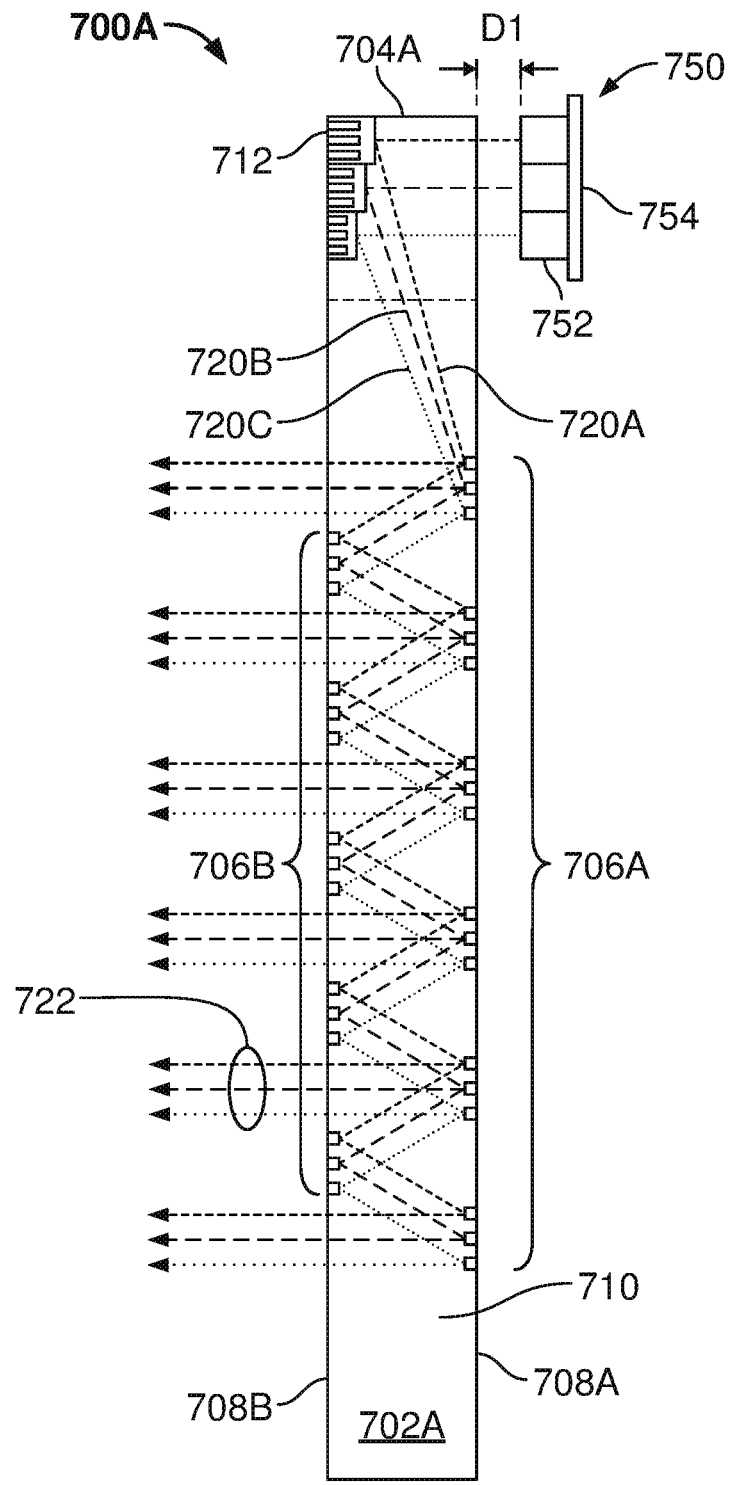
FIGS. 7A, 7B, 7C, and 7D are cross-sectional views of projector devices and waveguide configurations, according to some embodiments.

In FIG. 7A, a waveguide configuration 700A is disposed in cooperation with a projector device 750, which may include one or more monochromatic emitters 752 secured to a support structure 754 (e.g., a printed circuit board or another structure). The support structure 754 may be coupled to the frame 105 of FIG. 1. The waveguide configuration 700A may be separated from the projector device 750 by an air gap having a distance D1. The distance D1 may be in a range from approximately 50 µm to approximately 500 µm in some examples. The monochromatic image or images projected from the projector device 750 may pass through the air gap toward the waveguide configuration 700A. Any of the projector device embodiments described herein may be utilized as the projector device 750.

The waveguide configuration 700A may include a waveguide 702A, which may be formed from a glass or plastic material. The waveguide 702A may include a coupling area 704A and a decoupling area formed by decoupling elements 706A on a top surface 708A and decoupling elements 706B on a bottom surface 708B in some embodiments. The area within the waveguide 702A in between the decoupling elements 706A and 706B may be considered a propagation area 710, in which light images received from the projector device 750 and coupled into the waveguide 702A by coupling elements included in the coupling area 704A may propagate laterally within the waveguide 702A.

The coupling area 704A may include a coupling element 712 configured and dimensioned to couple light of a predetermined wavelength, e.g., red, green, or blue light. When a white light emitter array is included in the projector device 750, the portion of the white light that falls in the predetermined wavelength may be coupled by each of the coupling elements 712. In some embodiments, the coupling elements 712 may be gratings, such as Bragg gratings, dimensioned to couple a predetermined wavelength of light. In some examples, the gratings of each coupling element 712 may exhibit a separation distance between gratings associated with the predetermined wavelength of light that the particular coupling element 712 is to couple into the waveguide 702A, resulting in different grating separation distances for each coupling element 712. Accordingly, each coupling element 712 may couple a limited portion of the white light from the white light emitter array when included. In other examples, the grating separation distance may be the same for each coupling element 712. In some examples, coupling element 712 may be or include a multiplexed coupler.

As shown in FIG. 7A, a red image 720A, a blue image 720B, and a green image 720C may be coupled by the coupling elements of the coupling area 704A into the propagation area 710 and may begin traversing laterally within the waveguide 702A. A portion of the light may be projected out of the waveguide 702A after the light contacts the decoupling element 706A for one-dimensional pupil replication, and after the light contacts both the decoupling element 706A and the decoupling element 706B for two-dimensional pupil replication. In two-dimensional pupil replication embodiments, the light may be projected out of the waveguide 702A at locations where the pattern of the decoupling element 706A intersects the pattern of the decoupling element 706B.

The portion of light that is not projected out of the waveguide 702A by the decoupling element 706A may be reflected off the decoupling element 706B. The decoupling element 706B may reflect all incident light back toward the decoupling element 706A, as depicted. Accordingly, the waveguide 702A may combine the red image 720A, the blue image 720B, and the green image 720C into a polychromatic image instance, which may be referred to as a pupil replication 722. The polychromatic pupil replication 722 may be projected toward the eyebox 230 of FIG. 2 and to the eye 220, which may interpret the pupil replication 722 as a full-color image (e.g., an image including colors in addition to red, green, and blue). The waveguide 702A may produce tens or hundreds of pupil replications 722 or may produce a single replication 722.

Figure 7B:
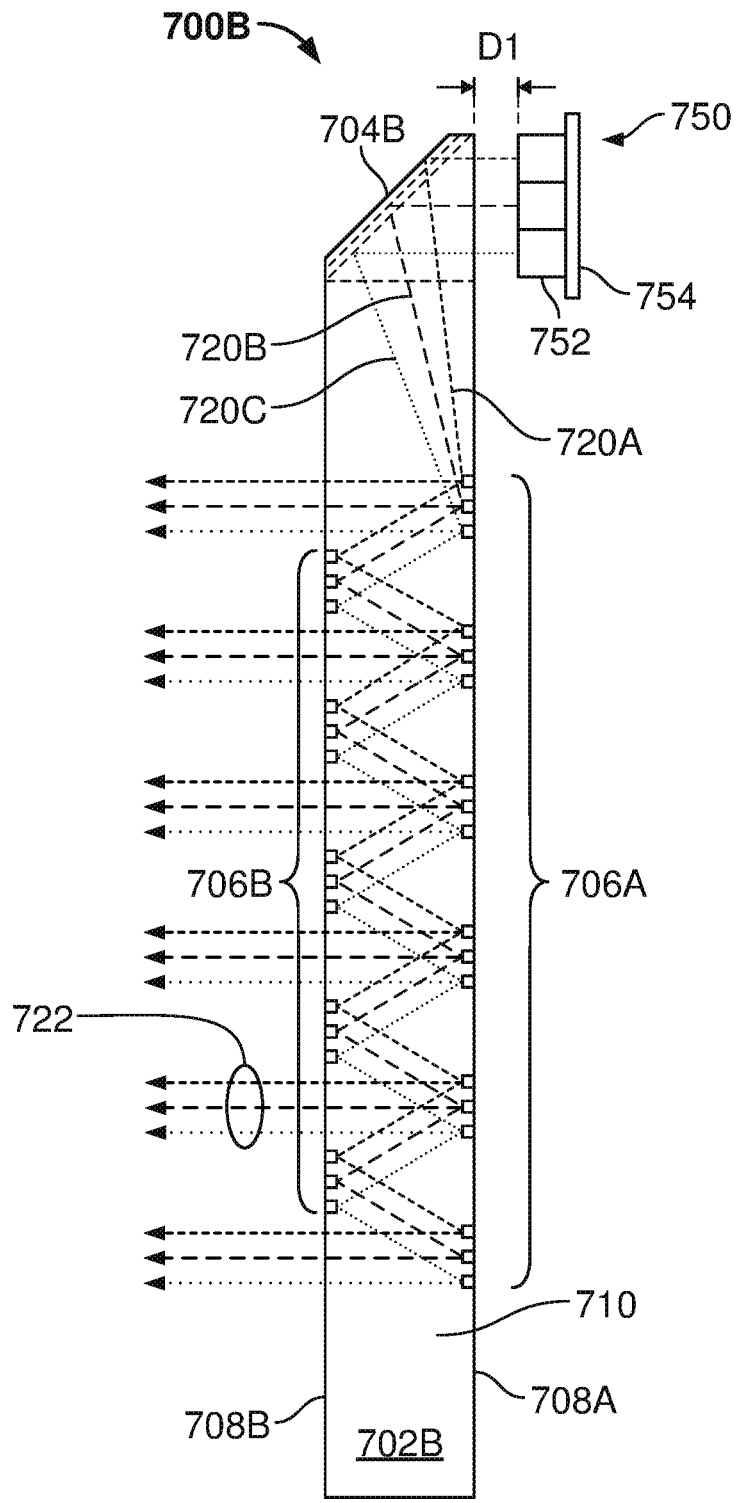
Figure 7C:
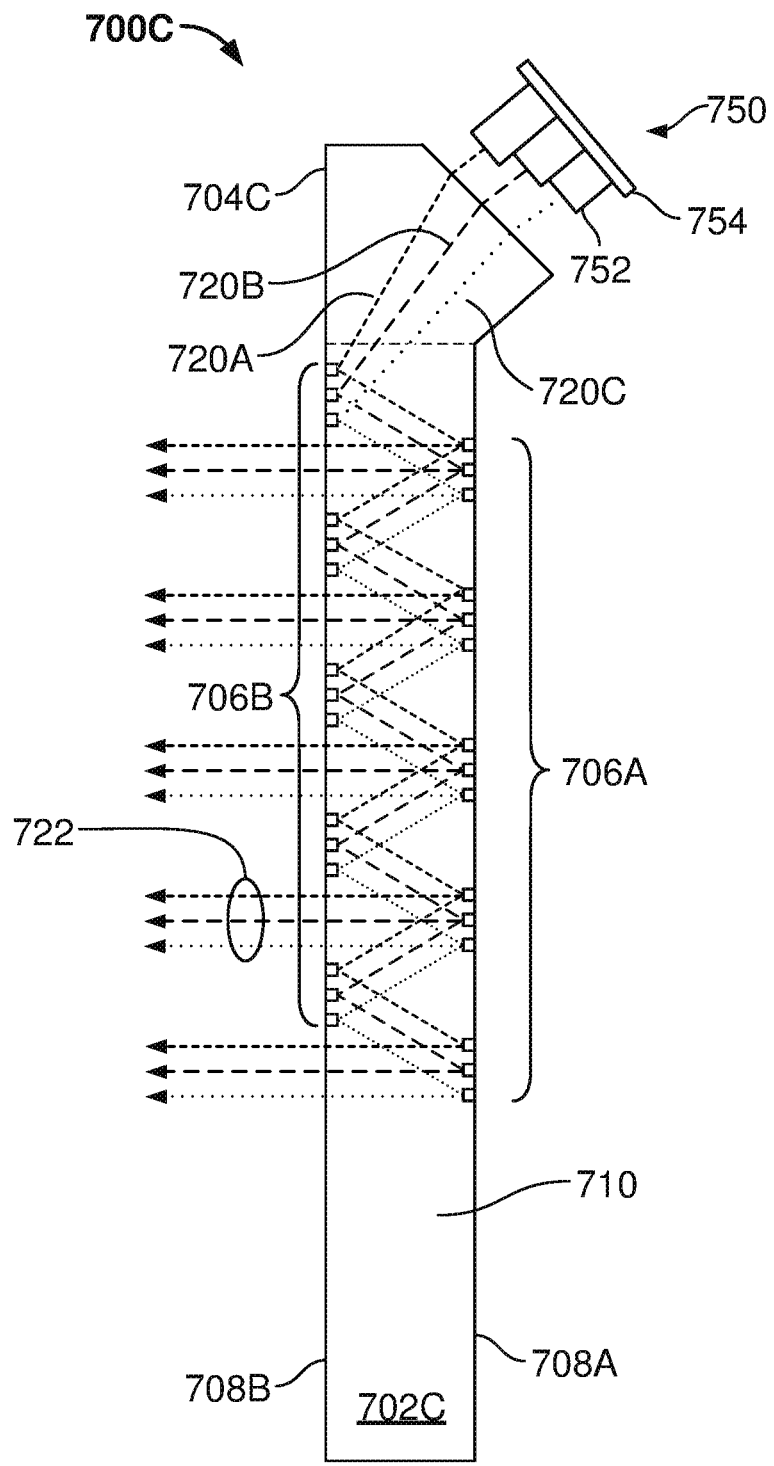

FIG. 7B is a cross-sectional view of a waveguide configuration 700B and the projector device 750. The waveguide configuration 700B may be similar to the waveguide configuration 700A of FIG. 7A in many respects. The waveguide configuration 700B may differ from the waveguide configuration 700A in that the waveguide 702B may include a different coupling area 704B. Rather than include gratings as coupling elements 712, the coupling area 704B of the waveguide configuration 700B may include a prism, extending inwardly from the bottom surface 708B, that reflects and refracts received image light, directing it toward the decoupling element 706A. Similarly, FIG. 7C is a cross-sectional view of a waveguide configuration 700C and the projector device 750. The waveguide configuration 700C may also include many of the features described herein in connection with the waveguide configuration 700A of FIG. 7A. The waveguide configuration 700C may include a waveguide 702C having a coupling area 704C with a prismatic element that protrudes upwardly from the top surface 708A.

Figure 7D:
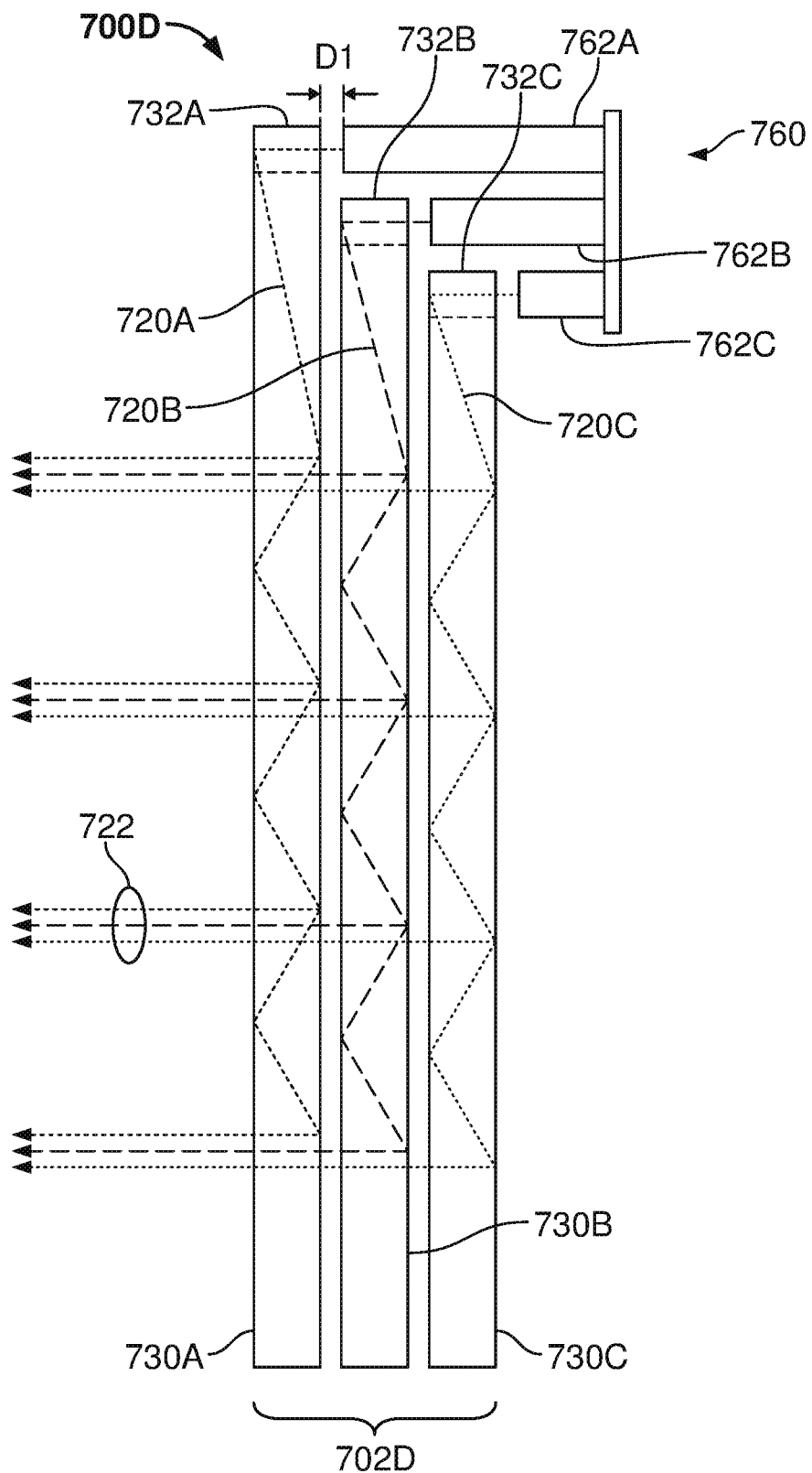

FIG. 7D is a cross-sectional view of a waveguide configuration 700D and a projector device 760. The waveguide configuration 700D may include multiple waveguides. As shown, a set of waveguides 702D may include a first waveguide 730A, a second waveguide 730B, and a third waveguide 730C. Each of the waveguides 730 may include its own coupling area 732A, 732B, and 732C, respectively. Each of the coupling areas 732 may be adapted to receive a predetermined wavelength of light. Similarly, each of the waveguides 730 may be adapted to receive a predetermined wavelength of light by having a predetermined thickness based on the wavelength of light, for example. Other optical properties of the waveguides 730 may be adapted based on the predetermined wavelength of light the waveguide is to receive. Each of the waveguides 730 may have decoupling areas that may also be specifically adapted for the predetermined wavelength of light. The decoupling elements 706A and 706B have not been explicitly depicted in FIG. 7D for clarity.

Like the projector device 400C of FIG. 4C, the projector device 760 may include array housings of different lengths for different colors. As shown, the array housing 762A may be longer than the array housing 762B, which in turn may be longer than the array housing 762C. The height or barrel length associated with each individual emitter array of the projector device 760 may allow for improved optics, increased heat dissipation, etc. As noted herein, the tallest array housing 762A may include an emitter array that emits green light or green images, because human eyes are most responsive to green light wavelengths. When using a stacked waveguide configuration, like the waveguide configuration 700D, each waveguide 730 should accommodate each other waveguide. For example, the waveguide 730A may pass (1) the image 720B, which may be projected by the waveguide 730B, and (2) the image 720C, which may be projected by the waveguide 730C. Similarly, the waveguide 730B may pass the image 720C, which may be projected by the waveguide 730C. In this way, the pupil replication 722 may include the visually aligned and overlapping images 720A, 720B, and 720C.

Because the barrel of the array housing 762A may extend from above a top surface of the waveguide 730C to a bottom surface of the waveguide 730B, both the waveguide 730C and the waveguide 730B may be shaped or configured to accommodate the housing 762A. For example, a notch or cutout may be formed in the waveguide 730B to accommodate the array housing 762A. Similarly, a notch or cutout may be formed in the waveguide 730C to accommodate both the array housing 762A and the array housing 762B. The waveguide 730A may not require any cutout because no array housing may extend beyond the top surface of the waveguide 730A.

While FIGS. 7A-D illustrate various waveguide configurations 700A-700D that may be employed in conjunction with various monochromatic emitter arrays discussed herein, other waveguide configurations not specifically disclosed herein that receive light from monochromatic emitter arrays (e.g., monochromatic emitter arrays 402A-D) and combine that light to produce a polychromatic image may also be employed in other embodiments. For example, while FIGS. 7A-D generally show the projector device 750 having multiple monochromatic emitters 752 coupled to the same support structure 754, other embodiments may employ a projector device 750 with separate monochromatic emitters 752 located at disparate locations about the waveguide configuration 700 (e.g., one or more monochromatic emitters 752 located near a top surface of the waveguide configuration 700 and one or more monochromatic emitters 752 located near a bottom surface of the waveguide configuration 700).

Figure 8:
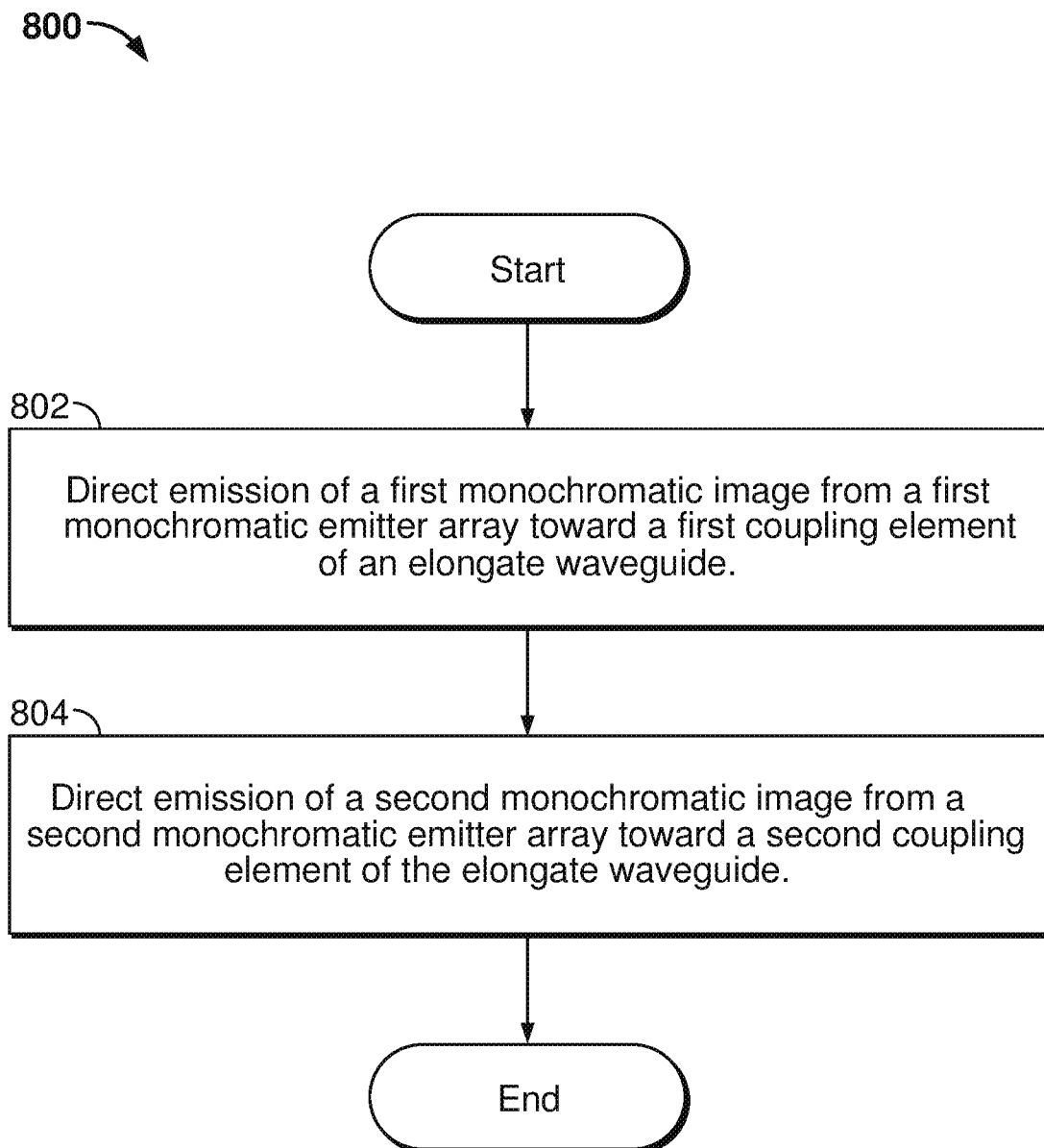
FIG. 8 is a flowchart of a method of displaying an image in a display system, according to some embodiments.

FIG. 8 is a flowchart of a method 800 of displaying an image in a display system or NED like those shown in FIGS. 7A-D, according to some embodiments. One or more of the steps shown in FIG. 8 may be performed by any suitable computer-executable code and/or computing system, including the system(s) illustrated in FIGS. 1, 2, 3, etc. For example, one or more of the steps may be performed by the controller 330 of FIG. 3 or other processing devices described herein. In one example, each of the steps shown in FIG. 8 may represent an algorithm whose structure includes and/or is represented by multiple sub-steps, examples of which will be provided in greater detail below. Embodiments of the method 800 may include additional steps before, after, in between, or as part of the enumerated steps shown in FIG. 8.

As illustrated in FIG. 8, at a step 802, a processing device may cause emission of a first monochromatic image from a first monochromatic emitter array toward a first coupling element of a waveguide. For example, the controller 330 may direct the monochromatic emitter array 402A of the projector device 400A of FIG. 4A to emit a first monochromatic image. In this example, the monochromatic image may be an image consisting of red light. The monochromatic image may be directed to a coupling element 712 included in the coupling area 704A of the waveguide configuration 700A of FIG. 7A. In some embodiments, the processing device, such as the controller 330 or another processing device, may direct the decomposition or may decompose a full-color image to a plurality of monochromatic images including the first monochromatic image.

At a step 804, the processing device may direct emission of a second monochromatic image from a second monochromatic emitter array toward a second coupling element of the waveguide. For example, the controller 330 may cause the monochromatic emitter array 402B of the projector device 400A of FIG. 4A to emit the second monochromatic image, which may be a monochromatic image consisting of blue light. The blue light monochromatic image may be projected to a corresponding coupling element 712 of the waveguide configuration 700A.

As a result of steps 802 and 804, a polychromatic image may be directed or projected from a decoupling element of the waveguide, with the polychromatic image being a combination of the first and second monochromatic images. For example, a polychromatic image may be provided in the pupil replication 722 of FIG. 7A, which may combine the monochromatic images 720A, 720B, and 720C into a single full-color image, which may be projected by the decoupling elements 706A toward an eyebox 230 and therethrough to the eye 220 of a user. The projection of the polychromatic image may be a consequence of the processing device direction emission of the first and second monochromatic images into the waveguide and of the optical features of the waveguide itself.

Some embodiments of the method 800 may result in replicating a polychromatic image to produce a plurality of instances of the polychromatic image within the waveguide, in which projecting the polychromatic image from the decoupling element of the waveguide may include projecting the plurality of instances of the polychromatic image from the decoupling element. For example, the waveguide 702A may produce a plurality of pupil replications like the pupil replication 722.

In some additional embodiments of the method 800, the first coupling element may receive the emitted first monochromatic image on a first surface of the waveguide and the decoupling element may project the polychromatic image toward an eyebox from a second surface of the waveguide, with the second surface being disposed opposite the first surface. For example, the coupling element 712 may receive the image 720A through a top surface 708A of the waveguide 702A. The pupil replications 722 may be emitted through the bottom surface 708B.

Additionally, some embodiments of the method 800 may include a step of directing emission of a white-light monochromatic image from a monochromatic emitter array by activating a plurality of LEDs that emit white light. For example, the monochromatic emitter array 402D of FIG. 4B may include white light emitters that can be activated to produce a white light image.

Also, in some embodiments of the method 800, the controller 330 may receive a signal representing a polychromatic or "white-light" image, which the controller 330 may decompose in constituent colors of a color space, where each of the constituent colors defines the monochromatic image to be produced by each monochromatic emitter array 402A-D. Additionally, some embodiments of the method 800 may include a tangible, non-transitory computer-readable medium having instructions corresponding to one or more of the described steps or operations of the method 800 stored thereon. When a processing device executes the instructions, the processing device may perform one or more of the steps of the method 800.

Figure 9A:
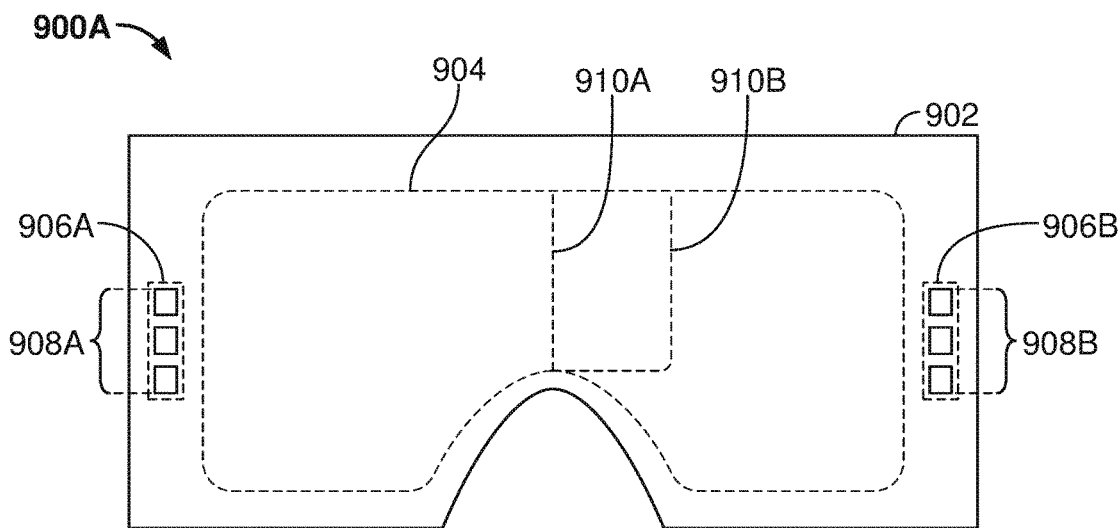
FIGS. 9A, 9B, and 9C are perspective views of NEDs, according to some embodiments.
Figure 9B:
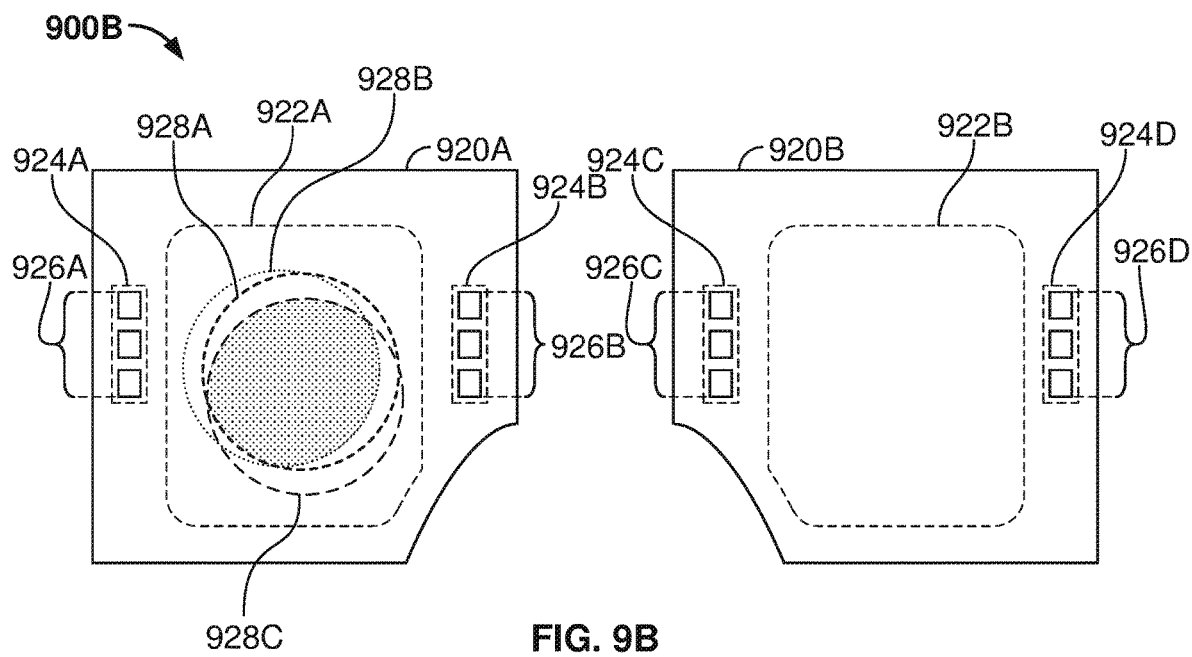
Figure 9C:
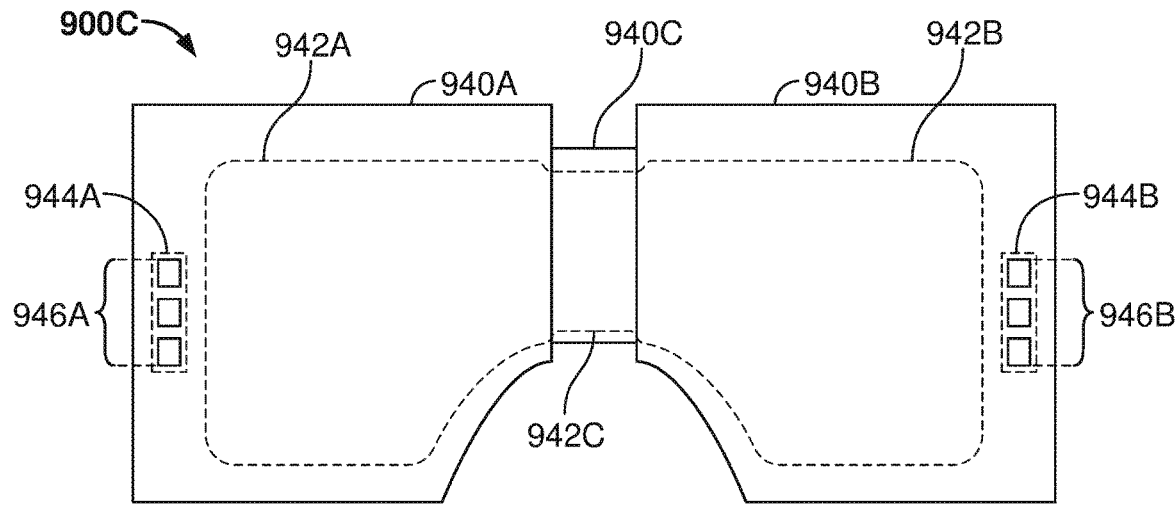

FIGS. 9A, 9B, and 9C are perspective views of display systems or NEDs, according to some embodiments. The NED 900A in FIG. 9A may include an elongate waveguide configuration 902 that may be wide or long enough to project images to both eyes of a user. The waveguide configuration 902 may include a decoupling area 904. In order to provide images to both eyes of the user through the waveguide configuration 902, multiple coupling areas 906 may be provided in a top surface of the waveguide of the waveguide configuration 902. The coupling areas 906A and 906B may include multiple coupling elements to interface with light images provided by an emitter array set 908A and an emitter array set 908B, respectively. Each of the emitter array sets 908 may include a plurality of monochromatic emitter arrays, as described herein. As shown, the emitter array sets 908 may each include a red emitter array, a green emitter array, and a blue emitter array. As described herein, some emitter array sets may further include a white emitter array or an emitter array emitting some other color or combination of colors.

In some implementations of the waveguide configuration 902, the emitter array sets 908 may cover approximately identical portions of the decoupling area 904, as shown by the divider line 910A. In other embodiments, the emitter array sets 908 may provide images into the waveguide of the waveguide configuration 902 asymmetrically, as shown by the divider line 910B. In such an implementation, the emitter array set 908A may provide images to more than half of the decoupling area 904, while the emitter array set 908B may provide images to less than half of the decoupling area 904. While the emitter array sets 908 may be disposed at opposite sides of the waveguide configuration 902 as shown in FIG. 9A, other embodiments may include emitter array sets 908 arranged at angles other than 180° apart. While the waveguide configuration 902 may be planar in some embodiments, it may also have a curved cross-sectional shape in other embodiments to better conform to the face/head of a user.

FIG. 9B is a perspective view of an NED 900B that has a waveguide configuration with a right eye waveguide 920A and a left eye waveguide 920B with decoupling areas 922A and 922B, respectively. The right eye waveguide 920A may include one or more coupling areas 924A, 924B, 924C, and 924D (all or a portion of which may be referred to collectively as coupling areas 924) and a corresponding number of emitter array sets 926A, 926B, 926C, and 926D (all or a portion of which may be referred to collectively as the emitter array sets 926). Accordingly, while the depicted embodiment of the right eye waveguide 920A may include two coupling areas 924 and two emitter array sets 926, other embodiments may include more or fewer. In some embodiments, the individual emitter arrays of an emitter array set may be disposed at different locations around a decoupling area. For example, the emitter array set 926A may include a red emitter array disposed along a left side of the decoupling area 922A, a green emitter array disposed along the top side of the decoupling area 922A, and a blue emitter array disposed along the right side of the decoupling area 922A. Accordingly, emitter arrays of an emitter array set may be disposed all together, in pairs, or individually, relative to a decoupling area.

The left eye waveguide 920B may include the same number and configuration of coupling areas 924 and emitter array sets 926 as the right eye waveguide 920A, in some embodiments. In other embodiments, the left eye waveguide 920B and the right eye waveguide 920A may include different numbers and configurations (e.g., positions and orientations) of coupling areas 924 and emitter array sets 926. Included in the depiction of the right eye waveguide 920A is a depiction of the effective pupil replication areas of the individual emitter arrays included in one emitter array set 926. For example, a red emitter array of the emitter array set 926 may produce pupil replications of a red image within the limited area 928A. A green emitter array may produce pupil replications of a green image within the limited area 928B. A blue emitter array may produce pupil replications of a blue image within the limited area 928C. Because the limited areas 928 may be different from one monochromatic emitter array to another, only the overlapping portions of the limited areas 928 may be able to provide full-color pupil replication, projected toward the eyebox 230.

FIG. 9C is a perspective view of an NED 900C that is similar to the NEDs 900A and 900B of FIGS. 9A and 9B in certain respects. The NED 900C may include a waveguide configuration that has a first waveguide portion 940A with a coupling area 944A and a second waveguide portion 940B with a coupling area 944B. As shown, waveguide portions 940A and 940B may be connected by a bridge waveguide 940C and may have decoupling areas 942A and 942B. The bridge waveguide 940C may permit light from the emitter array set 946A to propagate from the waveguide portion 940A into the waveguide portion 940B. Similarly, the bridge waveguide 940C may permit light emitted from the emitter array set 946B to propagate from the waveguide portion 940B into the waveguide portion 940A. In some embodiments, the bridge waveguide portion 940C may not include any decoupling elements, such that all light totally internally reflects within the waveguide portion 940C. In other embodiments, the bridge waveguide portion 940C may include a decoupling area 942C. In some embodiments, the bridge waveguide 940C may be used to obtain light from both waveguide portions 940A and 940B and couple the obtained light to a detection (e.g. a photodetector), such as to detect image misalignment between the waveguide portions 940A and 940B.

Figure 10A:
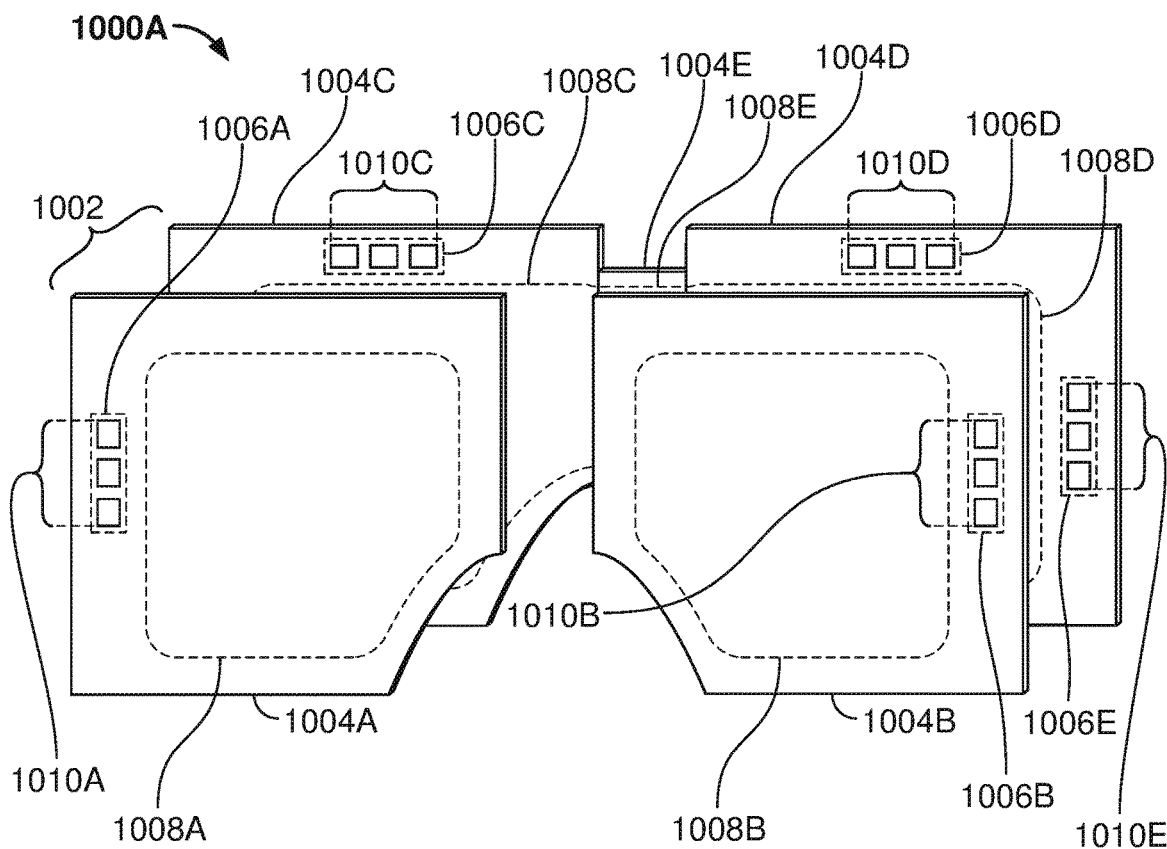
FIG. 10A is a perspective view of another NED, according to some embodiments.

FIG. 10A is a perspective view of another display system or NED 1000A, which has a multi-planar waveguide configuration 1002, according to some embodiments. As shown, the waveguide configuration 1002 may include a first waveguide portion 1004A and a second waveguide portion 1004B. The first and second waveguide portions 1004A and 1004B may be substantially coplanar and present images to a user on a first image plane. The first waveguide portion 1004A may include a coupling area 1006A and a decoupling area 1008A. The second waveguide portion 1004B may include a coupling area 1006B and a decoupling area 1008B. An emitter array set 1010A may be aligned with the coupling area 1006A and an emitter array set 10106 may be aligned with the coupling area 1006B.

The waveguide configuration 1002 may provide for a second image plane by inclusion of the third waveguide portion 1004C and the fourth waveguide portion 1004D. The third waveguide portion 1004C and the fourth waveguide portion 1004D may be connected by a bridge waveguide portion 1004E, such that decoupling areas 1008C, 1008D, and 1008E may define a unified propagation area for a second image plane. The third waveguide portion 1004C may include multiple coupling areas, of which the coupling area 1006C is visible in FIG. 10A. The fourth waveguide portion 1004D may include coupling areas 1006D and 1006E. Each of the coupling areas 1006C-E may have an associated emitter array set 1010C, 1010D, and 1010E, respectively. The waveguide configuration 1002 may provide for two image planes, such that the user may perceive projected images to be positioned at different depths.

Figure 10B:
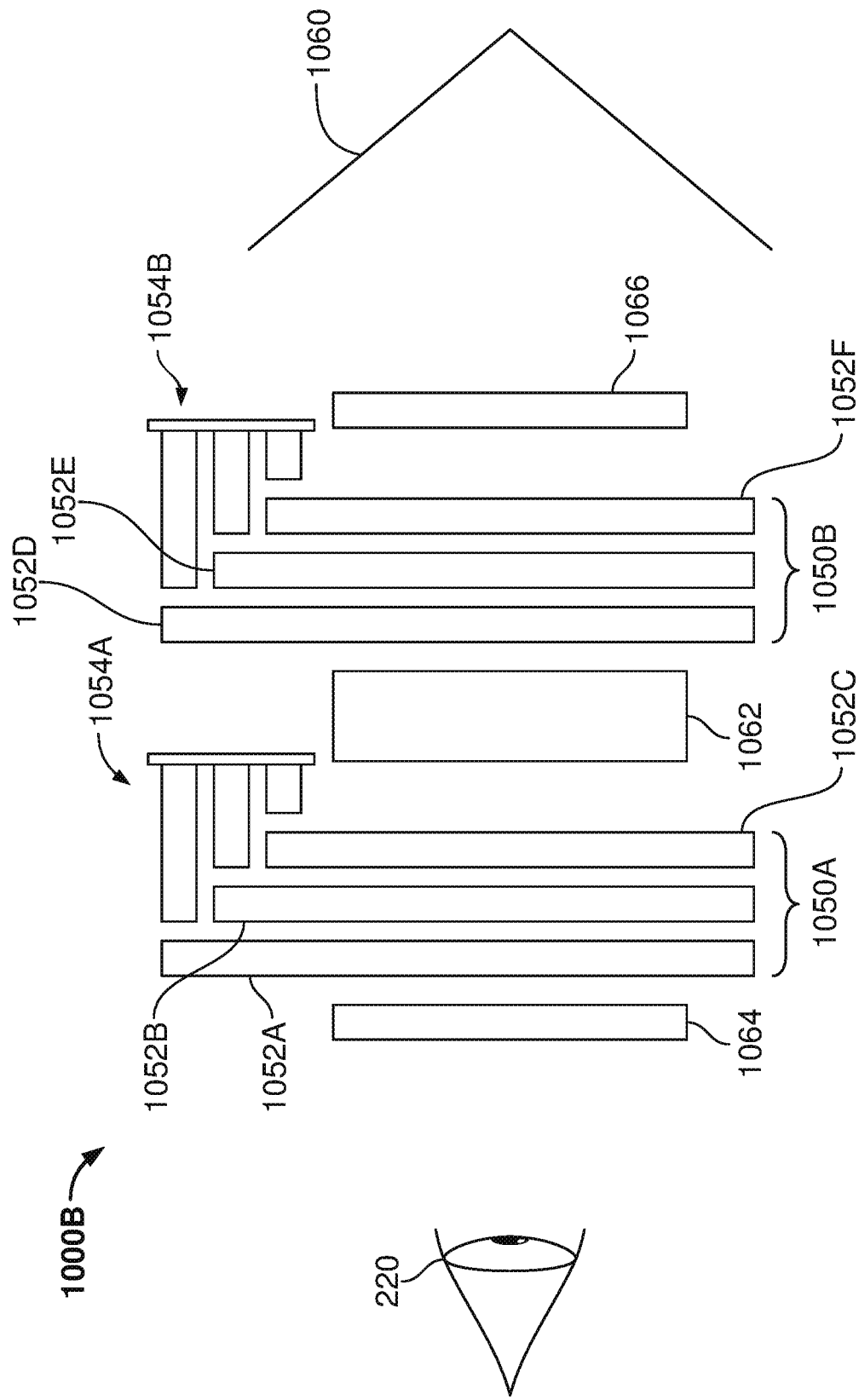
FIG. 10B is a cross-sectional view of the NED of FIG. 10A, according to some embodiments.

FIG. 10B is a cross-sectional view of the display system or NED 1000B, according to some embodiments. Like the NED 1000A of FIG. 10A, the NED 1000B may provide for multiple image planes. In the embodiment of the NED 1000B shown in FIG. 10B, the first image plane may be provided by the waveguide configuration 1050A, which may include three waveguides 1052A, 1052B, and 1052C for each of the three monochromatic emitter arrays included in the first projector device 1054A. The second image plane may be provided by the waveguide configuration 1050B, which may also include three waveguides 1052D, 1052E, and 1052F. The waveguides 1052A-F may be similar to other waveguides described herein, such as those depicted in FIGS. 7A-D. A second projector device 1054B may include three or more monochromatic emitter arrays as described herein. As noted, some embodiments of the present disclosure may permit a user to visualize information displayed by the waveguide configurations 1050A and 1050B while also visualizing a surrounding environment 1060 through the configurations 1050A and 1050B.

Embodiments of the NED 1000B may include optical components in addition to the waveguide configurations 1050A and 1050B. For example, an optical component 1062 may be disposed in between the waveguide configurations 1050A and 1050B. The optical component 1062 may be a lens or other optical component that can produce an apparent separation distance between the two image planes. For example, the optical component 1062 may be a −0.5 diopter (D) lens. In some embodiments, the optical component 1062 may be a variable focus component, such as an electrically-tunable liquid crystal lens or another variable-focus lens that can be adjusted by a controller, like the controller 330 of FIG. 3, using electrostatic, thermal, or mechanical actuators. The apparent separation distance, in diopter space, introduced by the optical component 1062 may range from approximately 0.3 D to approximately 1.5 D, in some embodiments. Additional optical components 1064 and 1066 may be included in some embodiments of the NED 1000B to improve performance. The optical components 1064 and/or 1066 may have fixed or variable focal lengths. The optical components 1062, 1064, and 1066 may be calibrated and operated such that the total lens effect sums to zero, so that little or no optical distortion of the surrounding environment 1060 is produced.

Embodiments as shown in FIGS. 10A and 10B, as well as others not specifically discussed above that may present multiple image planes to a viewer, may be employed to address the VAC problem mentioned above, thus potentially providing a more realistic and/or pleasing viewer experience.

Figure 11A:
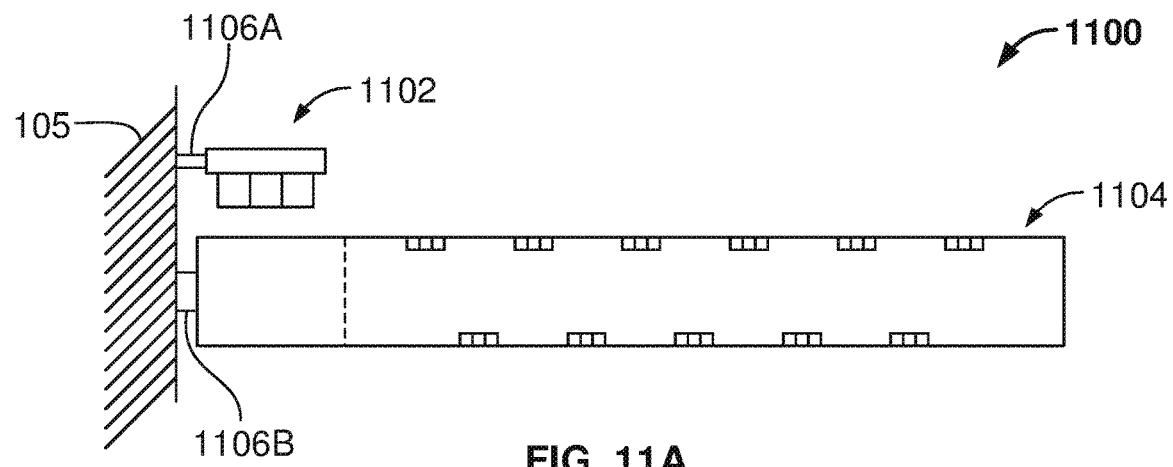
FIGS. 11A, 11B, 11C, and 11D are cross-sectional views of a NED having an actuation system, according to some embodiments.
Figure 11B:
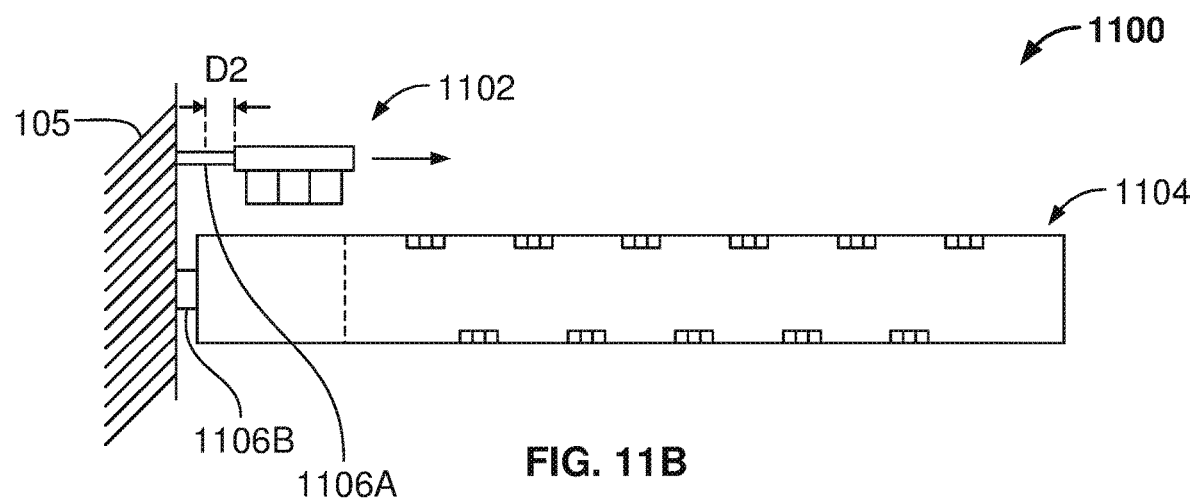
Figure 11C:
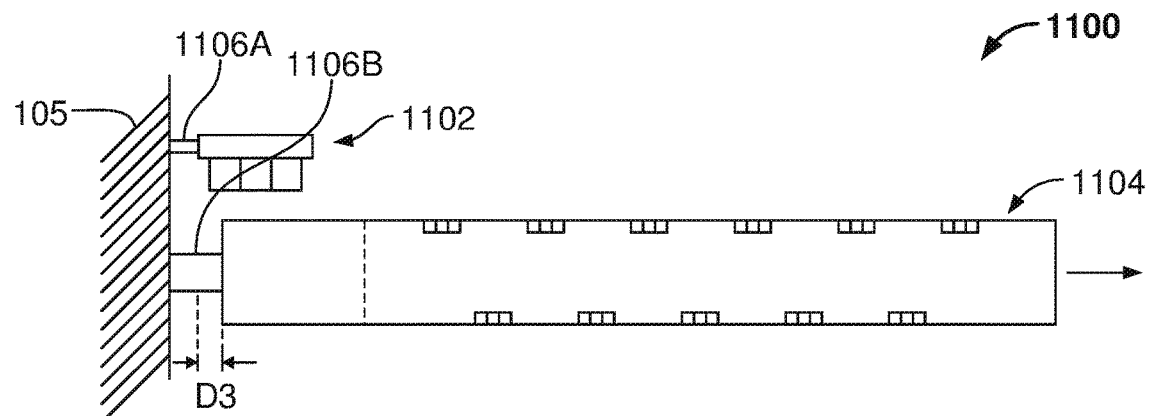

FIGS. 11A, 11B, and 11C are cross-sectional views of display systems having an actuation system, according to some embodiments. The display system 1100 of FIG. 11A may include a projector device 1102 and a waveguide configuration 1104. In some embodiments, either or both the projector device 1102 and the waveguide configuration 1104 may be coupled to the frame 105 of the HMD 100 of FIG. 1 by actuation components. The waveguide configuration 1104 and/or the projector device 1102 may be disposed within slots that ensure a parallel or otherwise fixed relationship in one dimension. The slots may prevent the projector device 1102 and/or the waveguide configuration 1104 may being disposed in a cantilevered configuration. For example, the projector device 1102 may be coupled to the frame 105 by an actuation component 1106A and by a first slot, while, additionally or alternatively, the waveguide configuration 1104 may be coupled to the frame 105 by an actuation component 1106B and a second slot.

In some embodiments, the actuation components 1106A and/or 1106B may be activated by the controller 330 of FIG. 3 or another processing device that operates as part of an actuation system. The actuation components 1106A and/or 1106B may be provided by a piezoelectric element, a voice coil motor, or another suitable actuation component that can dither or oscillate (e.g., move between at least a first position and a second position, such as between a first pixel position and an adjacent second pixel position, as perceived by the user) rapidly. For example, the actuation components 1106A and 1106B may be operated at an integer multiple of a frame rate of images to be provided to the user. For example, if the image frame rate is 60 Hz, the actuation system may operate at 120 Hz or at 180 Hz.

As shown in FIG. 11B, activation of the actuation component 1106A may cause displacement of the projector device 1102 relative to the frame 105 and/or the waveguide configuration 1104. The displacement may have a magnitude of displacement D2 in a first direction, such as the X-direction. In some embodiments, the actuation components 1106A and 1106B may operate along a single dimension. In other embodiments, the actuation components 1106A and 1106B may permit the projector device 1102 and/or the waveguide configuration 1104 to move in two dimensions, such as in the X-direction (e.g., left and right, as shown in FIG. 11B) and the Y-direction (e.g., in and out of FIG. 11B, from the perspective of the reader). The displacement D2 may correspond to the pitch of the individual emitter arrays included in the projector device 1102. For example, when the distance between the centers of neighboring emitters in an emitter array is two microns, the displacement D2 caused by activation of the actuation component 1106A may be two microns, an integer multiple thereof, a fraction thereof, or an integer plus some fraction thereof. In some embodiments, the displacement D2 may be a fraction of the distance between the centers of neighboring emitters. For example, the displacement D2 may be one-half or one-third of the distance between the centers of neighboring emitters, thus possibly facilitating higher operating frequencies for the actuation provided by actuation components 1106A and/or 1106B.

FIG. 11C depicts actuation of the actuation component 1106B, according to some embodiments. The activation of the actuation component 1106B may cause a displacement D3 of the waveguide configuration 1104 in the direction of the arrow included in FIG. 11C. The displacement may be similar to the displacement D2, such that the displacement D3 may be an integer multiple based on a pitch of the emitter arrays included in the projector device 1102 or may be a fraction thereof. In some embodiments, the actuation components 1106A and/or 1106B may alter the position and/or orientation of the projector device 1102 and/or the waveguide configuration 1104, respectively, in order to steer one or more pupil replications projected toward an eyebox 230 by a decoupling element or elements included in the waveguide configuration 1104.

Figure 11D:
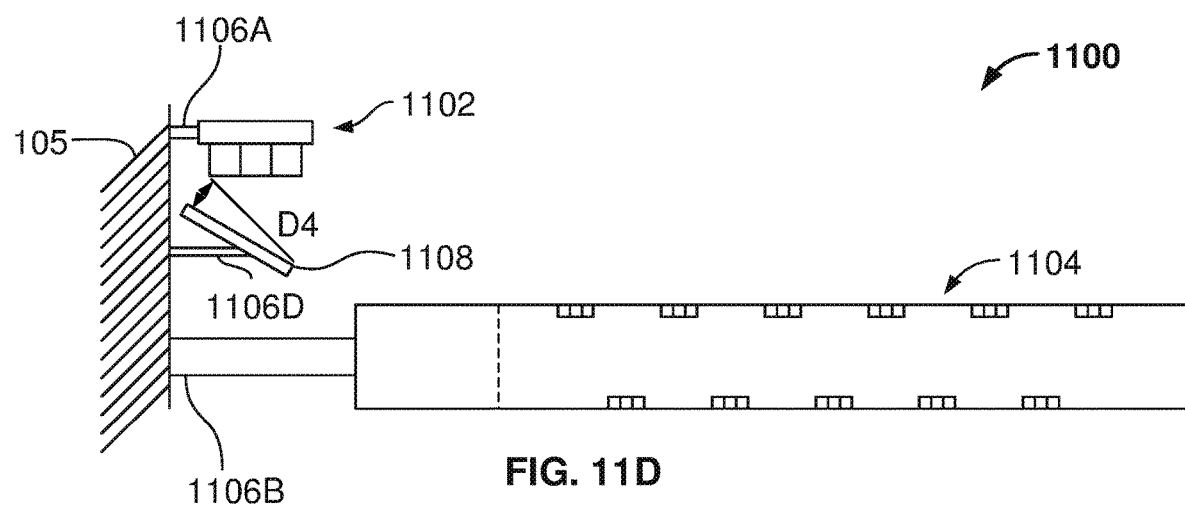

In some embodiments, an actuation component 1106 may be disposed in between the projector device 1102 and the waveguide configuration 1104, as shown in FIG. 11D. The actuation component 1106D may be coupled to a mirror 1108, or another suitable optical component, and may be activated to cause the angle of the mirror to change as shown by displacement D4. As the mirror 1108 is driven between different positions, the light may be coupled into the waveguide configuration 1104 may project out from different perspectives to provide the benefits of FIGS. 11A-D, as described herein.

In some embodiments, the actuation component 1106A coupling the projector device 1102 to the frame 105 may cause an angular or rotational movement of the projector device 1102 relative to the waveguide configuration 1104 to cause movement of the pixels some distance (e.g., a single pixel, a fraction of a pixel, an integer multiple of pixels, a number of pixels plus some fraction of a pixel, and so forth), as described above. In yet other examples, relative translation and/or orientation of the one or more monochromatic emitter arrays 402 relative to one or more optical components (e.g., one or more lenses) of their associated optical systems 406 may be employed to cause such pixel movement. In other embodiments, controllably altering an index of refraction of one or more of the optical components may provide such pixel movement as well.

Activation of the actuation components 1106A and/or 1106B may provide for the projection of higher resolution images or for compensating for faulty emitters included in one or more of the emitter arrays of the projector device 1102. Examples of such operations are included in FIGS. 12A-C, 13A-C, and 14A-B, which are described in greater detail below.

Figure 12A:
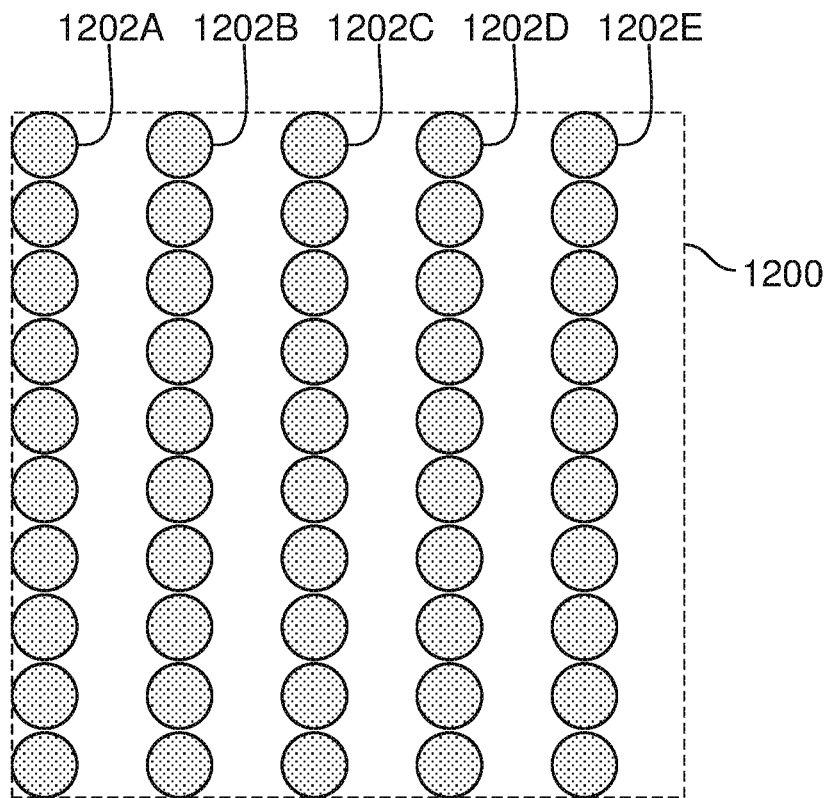
FIGS. 12A, 12B, and 12C are portions of images generated by embodiments of the NED of FIGS. 11A-D showing a process of resolution enhancement, according to some embodiments.
Figure 12B:
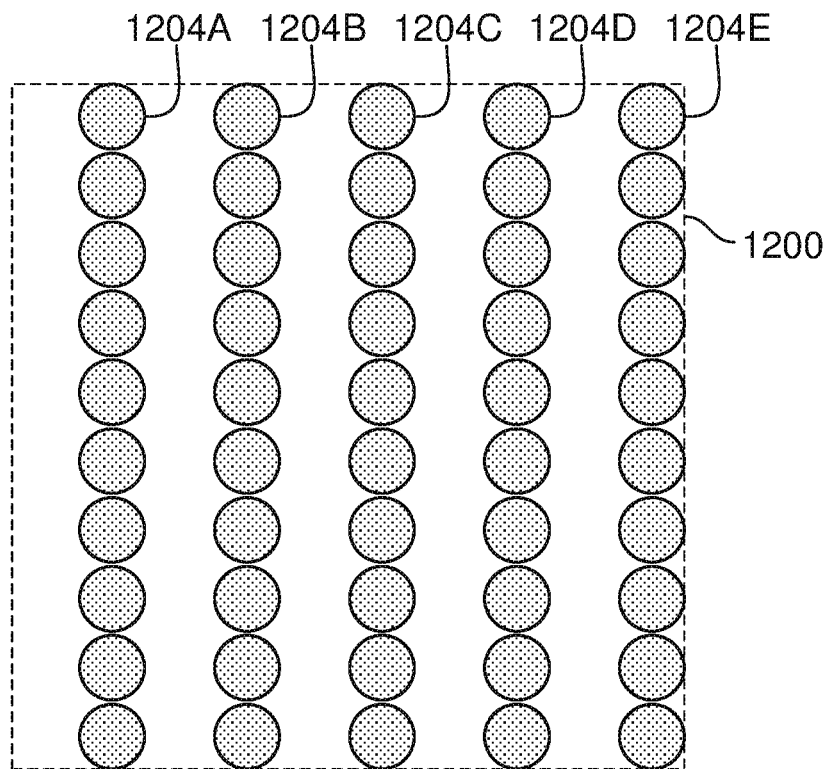
Figure 12C:
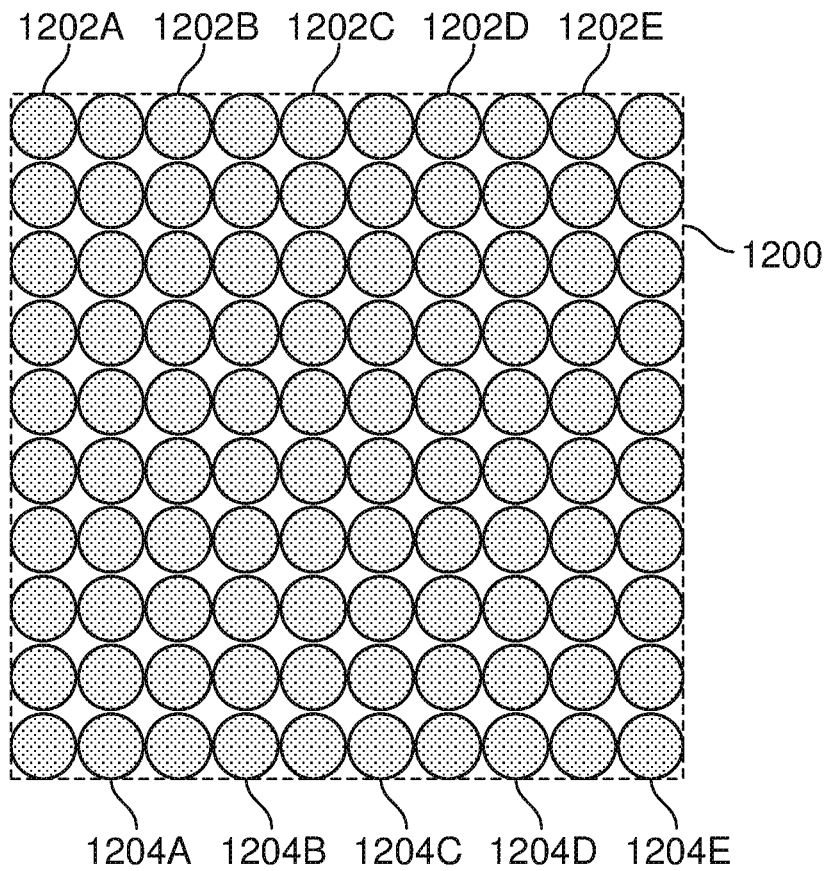

FIGS. 12A, 12B, and 12C depicts portions of images generated by embodiments of the display systems of FIGS. 11A-D showing a process of resolution enhancement, according to some embodiments. FIGS. 12A-C show a consistent portion of a pupil replication 1200, according to some embodiments. The portion is highly magnified such that individual image pixels are clearly shown as circular representations. As shown in FIG. 11A, the display system 1100 may be in a first configuration. For example, the projector device 1102 may be in a first position. While in the first position, an individual emitter array may produce rows of image pixels, including exemplary rows 1202A, 1202B, 1202C, 1202D, and 1202E. These rows 1202 may be produced at a first time when the projector device 1102 is in the first position. At a second time, after activation of the actuation component 1106A, the projector device 1102 may be moved by a displacement D2 to a second position. The displacement D2 may be equal to one half the separation distance between adjacent emitters in the emitter array. While in the second position, an individual emitter array of the projector device 1102 may be activated to project image pixels in the exemplary rows 1204A, 1204B, 1204C, 1204D, and 1204E. Accordingly, the image pixels shown in rows 1202 in FIG. 12A may be produced by the same emitters used to produce the image pixels shown in rows 1204 in FIG. 12B.

The image pixels in the rows 1202 may be image pixels of a first image or image portion, while the image pixels in the rows 1204 may be image pixels of a second image or image portion. Because the light incident on the eye 220 may persist for a brief amount of time, rapid oscillation between the first and second positions and projection of the two different sets of image pixels may be perceived by the user as a continuous image having more image pixels, thus providing some level of resolution greater than that provided by a single, static image provided by projector device 1102 and waveguide configuration 1104. In some embodiments, the emitter arrays may be fabricated to include half the number of emitters for the desired image resolution. The extra space between individual emitters may improve yield during fabrication. For example, an emitter array may be intentionally produced such that the number of pixels per unit of length is two, three, or four times greater in a first direction than in a second direction. The extra space may be used for circuitry and to relax the fabrication constraints for some features of the emitter array. In other examples, the extra space between pixels may be less than the pitch between pixels (e.g., to increase fabrication yield) while providing an increase in resolution due to the movement of the projector device 1102, as discussed above.

Figure 13A:
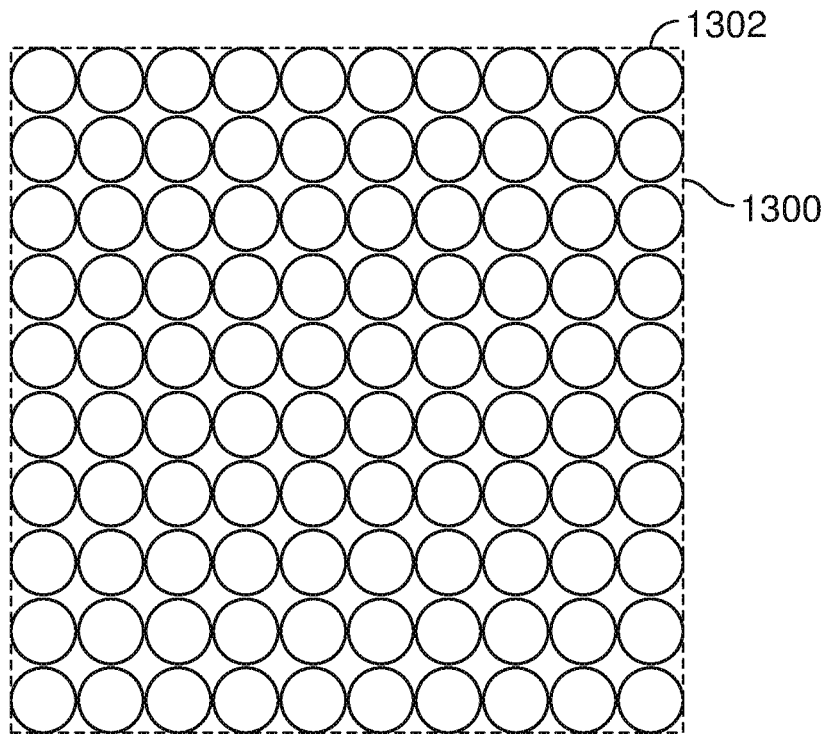
FIGS. 13A, 13B, and 13C are portions of images generated by embodiments of the NED of FIGS. 11A-D showing another process of resolution enhancement, according to some embodiments.
Figure 13B:
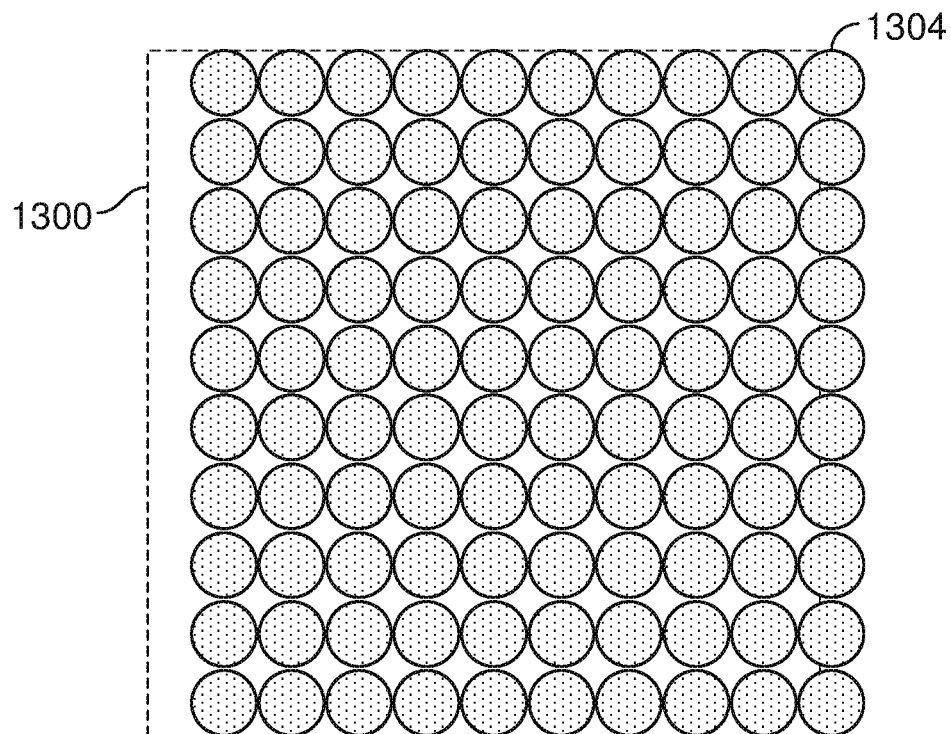
Figure 13C:
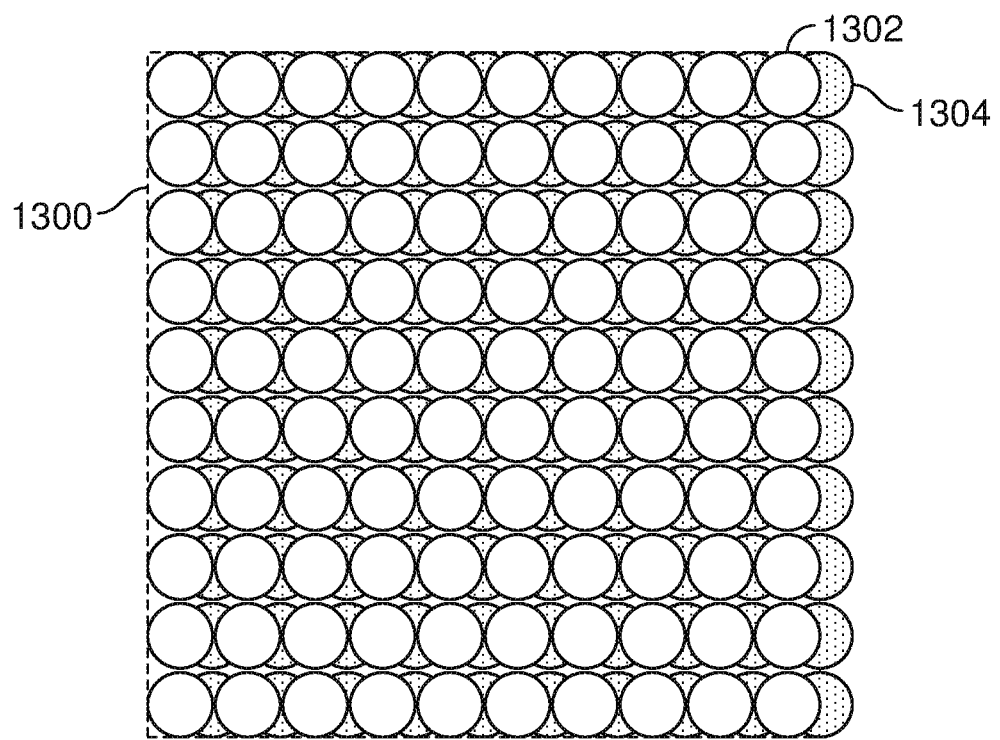

FIGS. 13A, 13B, and 13C show portions of images generated by embodiments of the display system or display system 1100 of FIGS. 11A-D, showing another process of resolution enhancement, according to some embodiments. FIG. 13A shows a pupil replication portion 1300 with a first set of image pixels 1302. After an activation of the actuation components 1106A and/or 1106B, the individual emitters of the emitter array may be activated again to produce a second set of image pixels 1304 as shown in FIG. 13B. Because the image pixels 1302 and the image pixels 1304 may be shown in rapid sequence in time, the pupil replication portion 1300 may appear to a user to simultaneously include image pixels 1302 and image pixels 1304. In this way, the display system 1100 may produce a higher resolution image, e.g., an image having a greater number of image pixels than an individual emitter array has emitters.

Figure 14A:
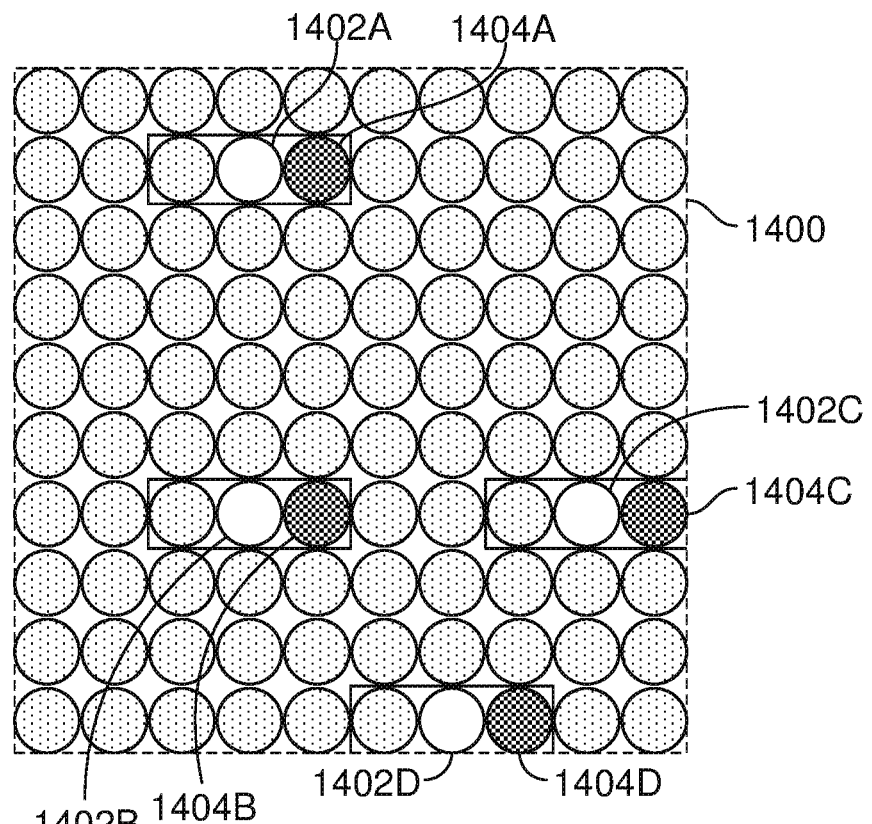
FIGS. 14A and 14B are portions of images generated by embodiments of the NED of FIGS. 11A-D showing a process of image enhancement, according to some embodiments.
Figure 14B:
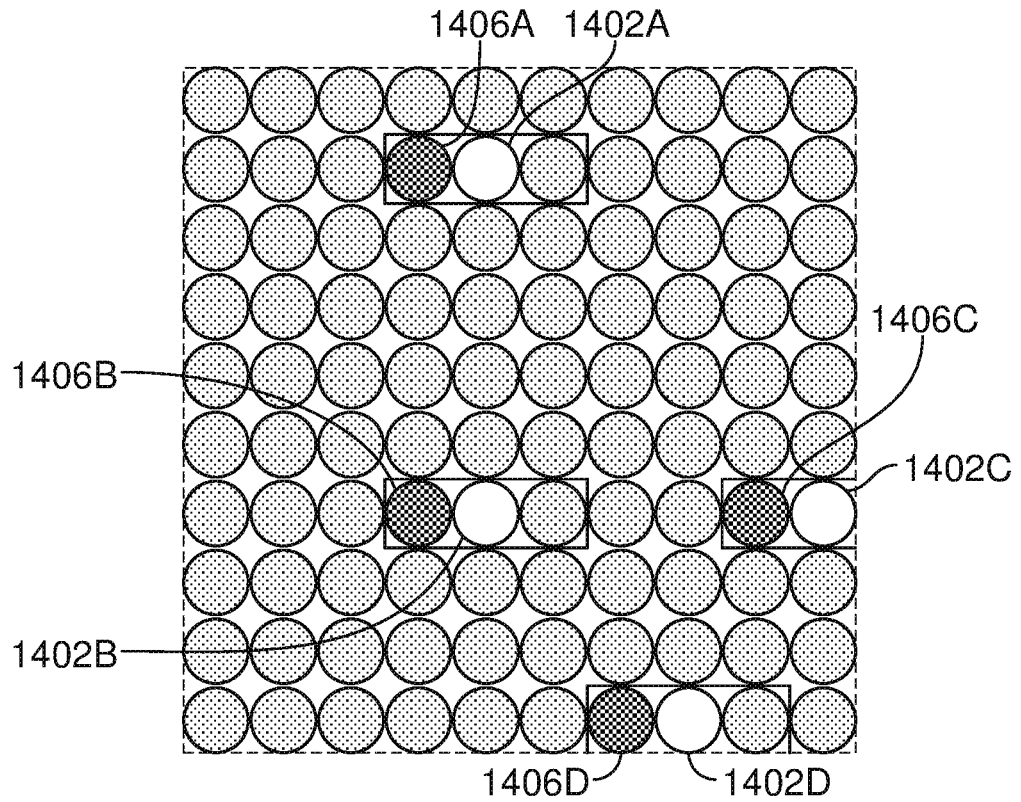

FIGS. 14A and 14B are portions of images generated by embodiments of the display system 1100 of FIGS. 11A-D showing a process of image enhancement, according to some embodiments. A pupil replication portion 1400 shows a plurality of image pixels including one or more faulty pixels. The pupil replication portion 1400 may include four exemplary faulty pixels 1402A, 1402B, 1402C, and 1402D. The faulty pixels may result from fabrication defects. For example, because of the size of the individual emitters, one or more emitters in a given emitter array may be nonfunctioning or inadequately functioning, such that the one or more emitters cannot be relied upon to produce image pixels. Such faulty emitters may be identified at a calibration or testing stage during fabrication of display systems, like the display system 1100. Neighboring emitters positioned along an axis of movement, e.g., on either side of the faulty emitter, may be identified and operated as described herein to compensate for the faulty emitter.

As shown in FIG. 14A, compensating pixels 1404A, 1404B, 1404C and 1404D may be produced by causing adjacent emitters to be operated at a higher brightness than normal. The brightness of the compensating pixels 1404 may be visually averaged by the eye 220 with the darkness of the neighboring faulty pixels 1402. When the projector device 1102 and/or the waveguide configuration 1104 are moved from a first position to a second position, a different neighboring emitter may be actuated at the increase brightness level as shown in FIG. 14B. For example, FIG. 14B shows that the compensating pixels 1406A, 1406B, 1406C, and 1406D may be produced by neighboring emitters on the opposite side of the faulty emitters. In some embodiments, the compensating pixels may not be operated at a different brightness level but may simply be operated at an average level of the intended pixel brightness and the neighboring pixel brightness. In some embodiments, three or more positions may be assumed by the projector device 1102 and/or the waveguide configuration 1104 so that three or more pixels may be employed to illuminate a single pixel position, as perceived by the user.

Figure 15:
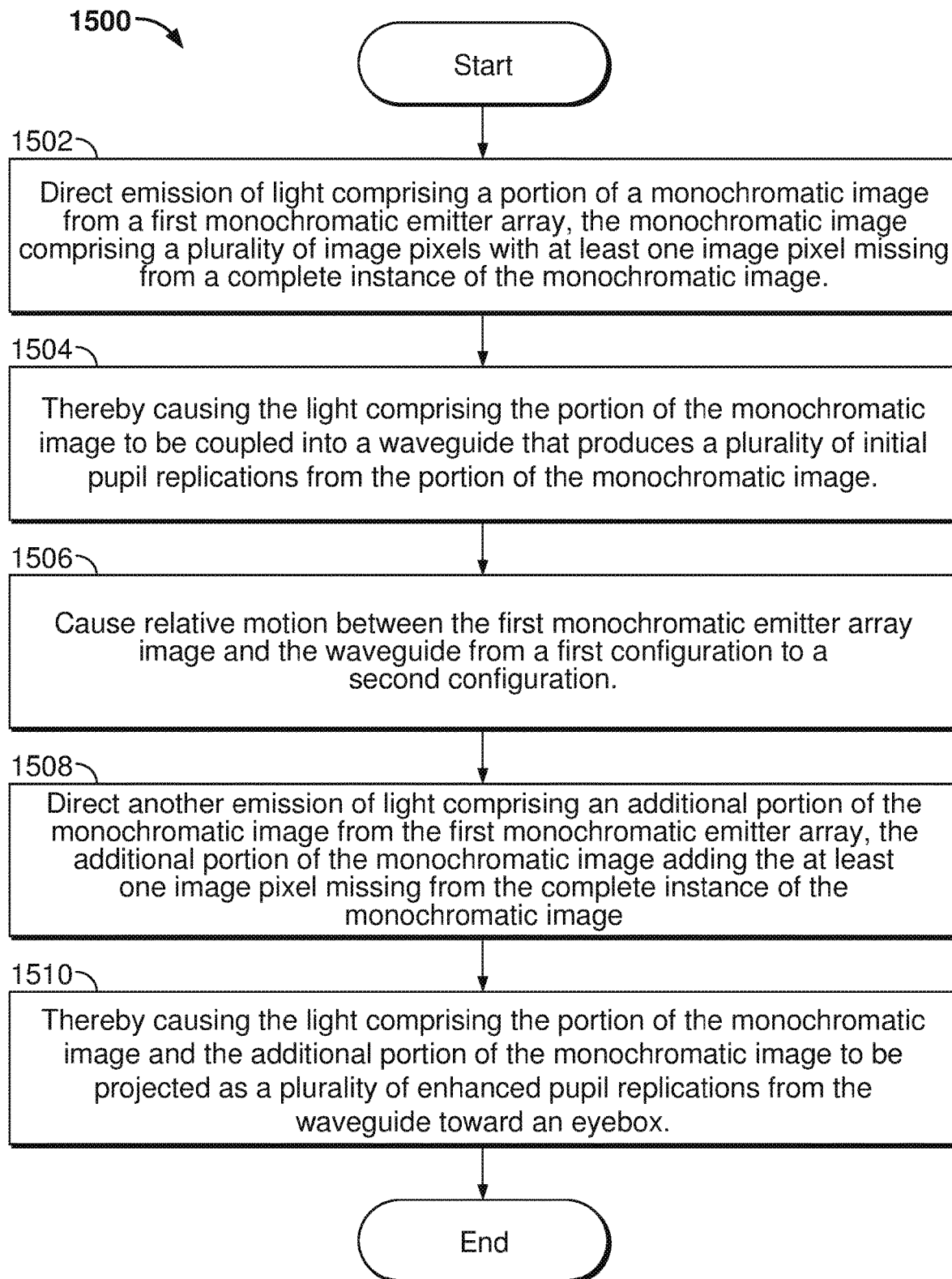
FIG. 15 is a flowchart of a method for enhancing images generated by a display system or NED like those of FIGS. 11A-D, according to some embodiments.

FIG. 15 is a flowchart of a method 1500 for enhancing images generated by display systems or NEDs like those of FIGS. 11A-D, according to some embodiments. While the method 1500 may be depicted as an enumerated sequence of steps or operations, embodiments of the method 1500 may include additional or alternative steps before, after, in between, or as part of the enumerated steps shown in FIG. 15.

Accordingly, some embodiments of the method 1500 may begin at a step 1502, in which a processing device may direct emission of light including a portion of a monochromatic image from a first monochromatic emitter array having a plurality of emitters of a first color disposed in a two-dimensional configuration. The monochromatic image may include a plurality of image pixels with at least one image pixel missing from a complete instance of the monochromatic image. For example, the controller 330 of FIG. 3 may direct emission of light from a monochromatic emitter array 402A of FIG. 4C. The emitter array 402A may include individual emitters like the microLEDs 600A and/or 600B of FIGS. 6A and 6B, respectively. The monochromatic image may be produced by a decomposition of a full-color image into constituent monochromatic images. The first projected image may include one or more missing or absent image pixels for a variety of reasons. For example, the monochromatic emitter array 402A may include one or more faulty emitters that are not capable of producing a desired brightness level, as shown in FIGS. 14A and 14B. In other embodiments, the missing image pixel may be due to a configuration of emitters having spaces between rows such that gaps are present between rows of image pixels, as shown in FIGS. 12A-C and as described herein.

At a step 1504, the light comprising the portion of the monochromatic image may be coupled into a waveguide that produces a plurality of initial pupil replications from the portion of the monochromatic image. For example, the light produced by one of the emitter arrays of the projector device 750 may be coupled into the waveguide 702A by a coupling element 712 in the coupling area 704A. The interaction of the received light with the decoupling elements 706A and 706B may produce one or more pupil replications, like the pupil replication 722, which may include a replication of each of the images 720A-C.

At a step 1506, a processing device may cause relative motion (e.g., translation or/and angular orientation) between the first monochromatic emitter array and the waveguide from a first configuration to a second configuration. For example, the controller 330 may cause the projector device 1102 of FIG. 11A to be displaced by displacement D2 as shown in FIG. 11B. Alternatively or additionally, the controller 330 may cause displacement of the waveguide configuration 1104 as shown in FIG. 11C. This may be done by sending activation signals to the actuation components 1106A and/or 1106B. The relative motion may cause a change in configuration of the projector device 1102 and the waveguide configuration 1104. In other words, one or both the projector device 1102 and the waveguide configuration 1104 may be moved from a first position to a second position. Some embodiments may include additional positions. In yet other examples, such as those described above, such as controllably altering, or moving, one or more optical components of the projector device 1102, may be employed produce the desired image shifting.

At a step 1508, a processing device may direct another emission of light comprising an additional portion of the monochromatic image from the first monochromatic emitter array. The additional portion of the monochromatic image may add in the at least one image pixel missing from the complete instance of the monochromatic image. For example, the additional portion of the monochromatic image may be similar to the image pixels 1204A-E of FIG. 12B, which complement the image pixels 1202A-E of FIG. 12A to form the increased resolution image included in the pupil replication portion 1200 as shown in FIG. 12C. The additional portion may be the image pixels 1304 of FIG. 13C, in some embodiments. Additionally, the additional portion may be provided by the compensating image pixels 1404 of FIG. 14A or the compensating image pixels 1406 of FIG. 14B.

At a step 1510, the light comprising the portion of the monochromatic image and the additional portion of the monochromatic image may be projected as a plurality of enhanced pupil replications from the waveguide toward an eyebox. For example, the enhanced resolution images represented by the image pixels shown in FIGS. 12C, 13C, 14A, and 14B may be projected from the waveguide 702A as one or more pupil replications 722.

In some embodiments of the method 1500, directing emission of light that may include the portion of the monochromatic image may include directing emission of light comprising a first fraction of a total number of image pixels of the complete instance of the monochromatic image. For example, the image pixels 1202A-E may be one-half of the image pixels included in the desired image. In other embodiments, the first fraction may be one-third or one-fourth of the total image pixels.

Embodiments of the method 1500 may further include a step of directing the other emission of light including the additional portion of the monochromatic image by directing emission of light comprising a second fraction of the total number of image pixels of the complete instance of the monochromatic image. The second fraction may be one-half, two-thirds, three-fourths, or a smaller fraction, such as one-third or one-fourth. A sum of the first fraction of the total number of image pixels and the second fraction of the total number of image pixels may be approximately equal to the total number of image pixels of the complete instance of the monochromatic image. In some embodiments, more than two portions of an image may be combined by portions emitted by the monochromatic image array at more than two positions. Accordingly, the total number of image pixels of the complete instance of the monochromatic image may be greater than a count of emitters in the plurality of emitters of the first monochromatic emitter array.

In some embodiments, the method 1500 may further include steps in which a processing device, like the controller 330, may detect that a first emitter of the plurality of emitters of the first color is a faulty emitter that is unable to produce a first image pixel of the monochromatic image. In these embodiments, the processing device may further detect a location of the faulty emitter in the two-dimensional configuration of the plurality of emitters of the first monochromatic emitter array and identify a compensating emitter from a plurality of neighboring emitters that are adjacent to the first emitter and disposed along an axis of potential movement. In some embodiments, the step of directing the other emission of light including the additional portion of the monochromatic image may include directing the compensating emitter to produce the first image pixel to add the at least one image pixel missing from the complete instance of the monochromatic image. The processing device may direct operation of the compensating emitter at an increased brightness and/or operating duty cycle to compensate for the faulty emitter.

In some embodiments, causing relative motion between the first monochromatic emitter array and the waveguide from the first configuration to the second configuration may include activating an actuator system to displace the first monochromatic emitter array from a first position to a second position and/or activating the actuator system to displace the waveguide from a third position to a fourth position. Activating the actuator system to displace the first monochromatic emitter array from a first position to a second position may include displacing a second monochromatic emitter array having a plurality of emitters of a second color disposed in the two-dimensional configuration. The first monochromatic emitter array and the second monochromatic emitter array may be secured to a common platform, like the PCB 408 of FIG. 4A or a more secure platform, to which the PCB 408 may be secured. The first color and the second color may be different colors, such as red and blue or blue and green, etc.

Additionally, some embodiments of the method 1500 may include a tangible, non-transitory computer-readable medium having instructions corresponding to one or more of the described steps or operations of the method 1500 stored thereon. When a processing device executes the instructions, the processing device may perform one or more of the steps of the method 1500.

As detailed above, the computing devices and systems described and/or illustrated herein broadly represent any type or form of computing device or system capable of executing computer-readable instructions. In their most basic configuration, these computing device(s) may each include at least one memory device and at least one physical processing device.

In some examples, the term "memory device" generally refers to any type or form of volatile or non-volatile storage device or medium capable of storing data and/or computer-readable instructions. In one example, a memory device may store, load, and/or maintain one or more modules containing instructions for executing the processes or steps described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor," "processing device," or "controller" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, image processors, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may receive image data to be transformed, transform the image data by, for example, splitting the image data into monochromatic images, splitting monochromatic images into monochromatic image portions, outputting a result of the transformation and using the result of the transformation to project monochromatic images and image portions that may be combined by a waveguide configuration to general one or more pupil replications that are projected toward an eyebox. Additionally or alternatively, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

Embodiments of the instant disclosure may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a plurality of monochromatic emitter arrays, wherein each of the plurality of monochromatic emitter arrays has a plurality of emitters disposed in a two-dimensional configuration and emits a monochromatic image of a corresponding color;
   a waveguide configuration including:
      a top surface,
      a bottom surface disposed opposite the top surface,
      a coupling area that receives the monochromatic images; and
      a decoupling area that projects a plurality of instances of a polychromatic image comprising a combination of the monochromatic images toward an eyebox through the bottom surface; and
   an actuator system that produces lateral shifting of the plurality of instances of the polychromatic image between at least two positions relative to the waveguide configuration.

2. The apparatus of claim 1, wherein the actuator system alters an angular orientation of the plurality of monochromatic emitter arrays relative to the waveguide configuration.

3. The apparatus of claim 1, wherein:
   the apparatus further comprises a projector device comprising the plurality of monochromatic emitter arrays;
   the projector device further comprises at least one optical component that optically couples the monochromatic emitter arrays to the waveguide configuration; and
   the actuator system alters an index of refraction of the at least one optical component to produce the lateral shifting of the plurality of instances of the polychromatic image between the at least two positions relative to the waveguide configuration.

4. The apparatus of claim 1, wherein:
   the apparatus further comprises a projector device comprising the plurality of monochromatic emitter arrays;
   the projector device further comprises at least one optical component that optically couples the monochromatic emitter arrays to the waveguide configuration; and
   the actuator system alters at least one of an angular orientation or a translational position of the at least one optical component relative to the plurality of monochromatic emitter arrays to produce the lateral shifting of the plurality of instances of the polychromatic image between the at least two positions relative to the waveguide configuration.

5. The apparatus of claim 1, wherein the actuator system comprises:
   a plurality of actuator components, wherein each of the plurality of actuator components is secured to a corresponding one of the plurality of monochromatic emitter arrays and configured to move the corresponding one of the plurality of monochromatic emitter arrays with respect to the waveguide configuration.

6. The apparatus of claim 1, wherein the actuator system comprises:
   an actuator component secured to the plurality of monochromatic emitter arrays and configured to move the plurality of monochromatic emitter arrays as a unit with respect to the waveguide configuration.

7. The apparatus of claim 1, wherein the lateral shifting between the at least two positions corresponds to a fraction of a distance between adjacent emitters of the plurality of monochromatic emitter arrays.

8. The apparatus of claim 7, further comprising a controller, wherein:
   the at least two positions comprises an integer number of positions;
   the lateral shifting between the at least two positions comprises a reciprocal of the integer number of positions; and
   the controller causes each of the plurality of monochromatic emitter arrays to produce a corresponding portion of the monochromatic image at each of the integer number of positions.

9. The apparatus of claim 1, wherein the lateral shifting between the at leas two positions corresponds to an integer number of a distance between adjacent emitters of each of the plurality of monochromatic emitter arrays.

10. The apparatus of claim 9, further comprising a controller, wherein:
    the integer number is one;
    the at least two positions comprises a first position and a second position; and
    the controller causes each of the plurality of monochromatic emitter arrays to:
       produce the corresponding monochromatic image at the first position; and
       produce a shifted version of the corresponding monochromatic image at the second position.

11. The apparatus of claim 10, wherein the shifted version of the corresponding monochromatic image compensates for a nonfunctional or underperforming emitter of an associated one of the plurality of monochromatic emitter arrays.

12. The apparatus of claim 11, wherein the shifted version of the corresponding monochromatic image compensates for the nonfunctional or underperforming emitter of the associated one of the plurality of monochromatic emitter arrays by altering at least one of a brightness level or a duty cycle of a fully functional emitter of the associated one of the plurality of monochromatic emitter arrays.

13. The apparatus of claim 1, further comprising a controller that causes at least one of the plurality of monochromatic emitter arrays to produce a corresponding monochromatic image between the at least two positions.

14. A system comprising:
    a head-mounted display support configured for securing the system to a user; and
    a display system secured to the head-mounted display support and comprising:
       a plurality of monochromatic emitter arrays, wherein each of the plurality of monochromatic emitter arrays has a plurality of emitters disposed in a two-dimensional configuration and emits a monochromatic image of a corresponding color;
       a waveguide configuration including:
          a top surface,
          a bottom surface disposed opposite the top surface,
          a coupling area that receives the monochromatic images; and a decoupling area that projects a plurality of instances of a polychromatic image comprising a combination of the monochromatic images toward an eyebox through the bottom surface; and an actuator system that produces lateral shifting of the plurality of instances of the polychromatic image between at least two positions relative to the waveguide configuration.

* * * * *